United States Patent
Kokrady et al.

(10) Patent No.: US 9,158,683 B2
(45) Date of Patent: Oct. 13, 2015

(54) MULTIPORT MEMORY EMULATION USING SINGLE-PORT MEMORY DEVICES

(75) Inventors: Aman A Kokrady, Mayur Vihar Phase (IN); Shahid Ali, New Delhi (IN); Vish Visvanathan, Chennai (IN); Vinod Joseph Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 626 days.

(21) Appl. No.: 13/571,343

(22) Filed: Aug. 9, 2012

(65) Prior Publication Data
US 2014/0047197 A1    Feb. 13, 2014

(51) Int. Cl.
*G06F 12/06* (2006.01)
*G11C 8/16* (2006.01)

(52) U.S. Cl.
CPC ...... *G06F 12/06* (2013.01); *G11C 8/16* (2013.01); *Y02B 60/1225* (2013.01)

(58) Field of Classification Search
CPC .................................. G06F 12/06; G11C 8/16
See application file for complete search history.

(56) References Cited

U.S. PATENT DOCUMENTS

| | | | |
|---|---|---|---|
| 7,957,209 | B2 | 6/2011 | Ruckerbauer |
| 2006/0012603 | A1 | 1/2006 | Lindholm et al. |
| 2007/0073981 | A1 | 3/2007 | Im et al. |
| 2007/0150667 | A1 | 6/2007 | Bains et al. |
| 2008/0189467 | A1 | 8/2008 | Ikeda et al. |
| 2011/0310691 | A1* | 12/2011 | Zhou et al. ............... 365/230.03 |

* cited by examiner

*Primary Examiner* — Aracelis Ruiz
(74) *Attorney, Agent, or Firm* — John R. Pessetto; Frank D. Cimino

(57) ABSTRACT

A multiport memory emulator receives first and a second memory commands for concurrent processing of memory commands in one operation clock cycle. Data operands are stored in a memory array of bitcells that is arranged as rows and memory banks. An auxiliary memory bank provides a bitcell for physically storing an additional word for each row. The bank address portion of each of the first and second memory commands is respectively translated into a first and second physical bank address. The second physical bank address is assigned a bank address of a bank that is currently unused in response to a determination that the bank address portions are equal and the bank associated with the first bank address is designated as a currently unused bank for subsequently received memory commands in response to the determination that the bank address portions are equal. Simultaneous read and write operations are possible.

20 Claims, 19 Drawing Sheets

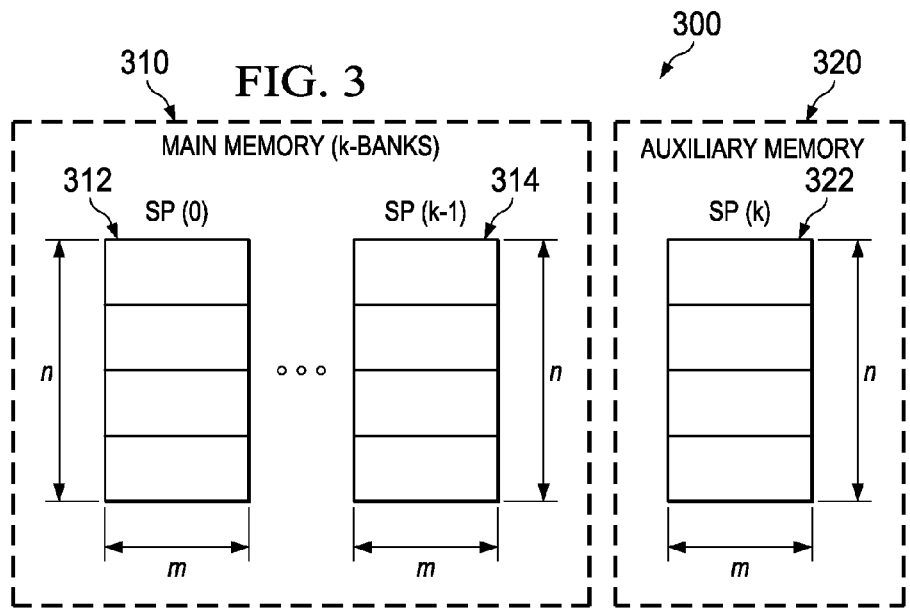
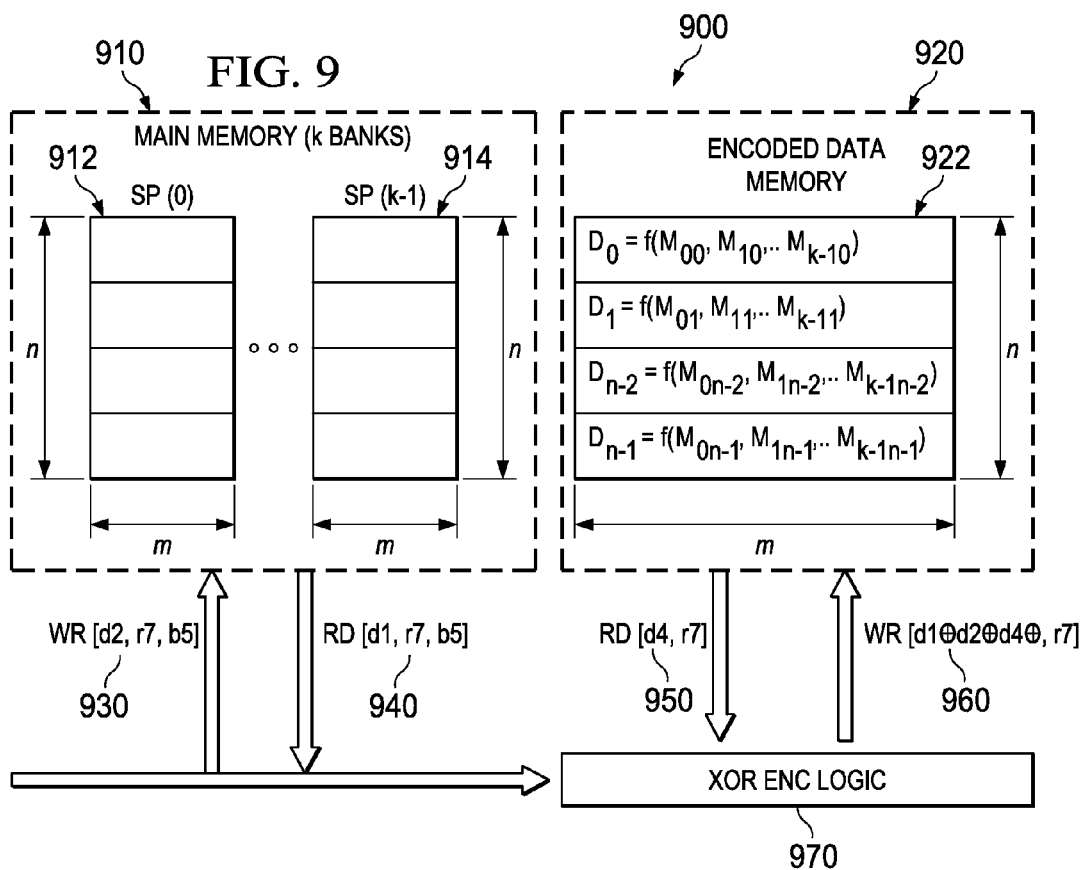

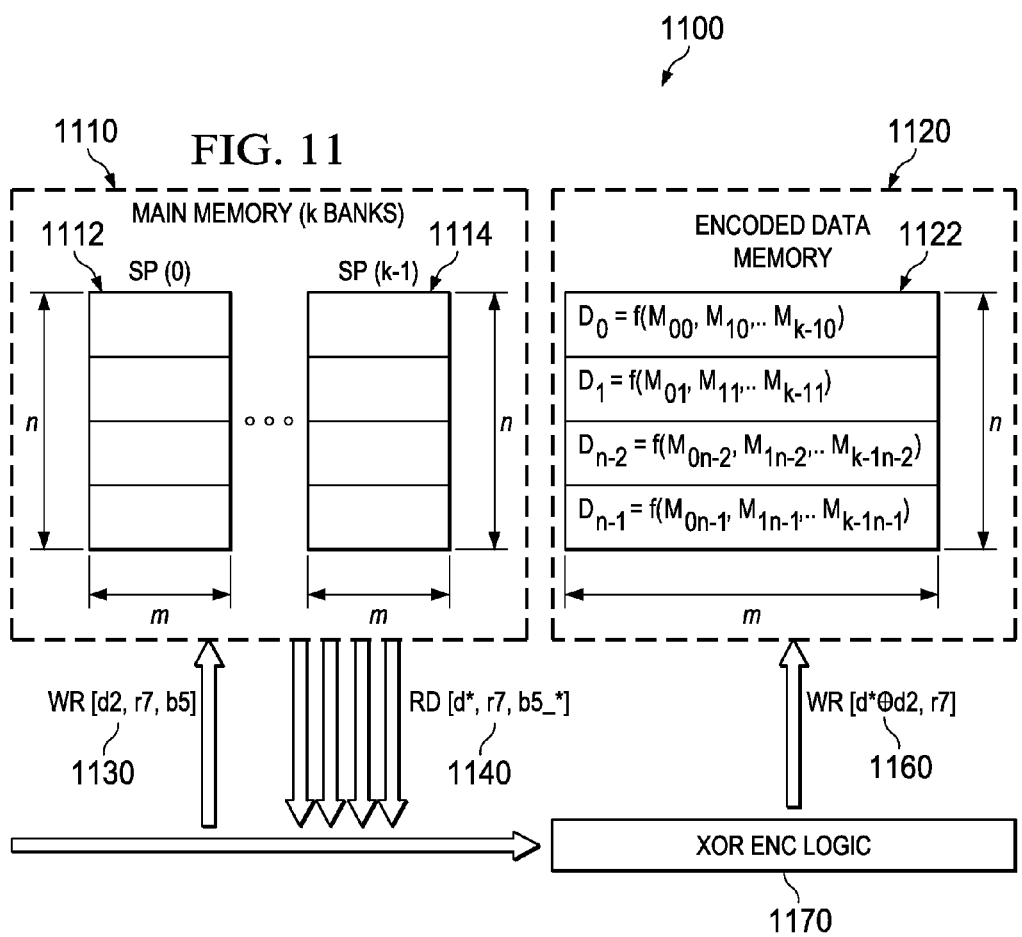

MULTIPORT MEMORY EMULATION USING SINGLE-PORT MEMORY DEVICES

BACKGROUND

Electronic devices include a wide variety of processors such as application specific integrated circuits (ASIC), digital signal processors (DSP), and microprocessors that use memory devices to store and retrieve information, for example. Very large scale integration (VLSI) circuits (e.g., on the scale of billions of transistors) often include multiple processors that each access and process information that is stored in memory devices that are shared by the multiple processors. The shared memory devices often include memory cells (e.g., bitcells) having multiple ports (e.g., multiport memories) so that the memory devices (and the information stored therein) can be accessed more quickly.

However, implementing multiport memories using space and/or time multiplexing typically requires a greater amount a layout space, increased power, decreased bandwidth, and/or combinations thereof. Space-multiplexing multiport memories, for example, are arranged using a multiplexor that is arranged to receive requests for first and second ports and to alternate sending the request to a memory. Time-multiplexing multiport memories, for example, are arranged using first and second memories that are arranged to respectively receive requests for first and second memories and a multiplexor that is arranged to alternate output the output of each of the first and second memories.

The space-multiplexing approach typically entails using a larger bitcell (e.g., using eight or more-transistors). The (layout) area of each multiport bitcell typically increases exponentially with the number of ports in the bitcell, which results in exponentially greater space requirements for greater numbers of ports in a bitcell. Space-multiplexing typically allows the multiport memory to run at frequencies close to that of a single-port memory. Thus, space-multiplexed memories often use twice the area of, offer similar performance to, and consume twice the power of a single-port memory.

The time-multiplexing approach includes using single-port memories that are coupled to arbitration and priority sequencing logic to avoid bank contentions. Individual port requests for a single-port memory are prioritized and are sequentially sent in time to the single-port memories. The serialization of the individual port requests results in lower frequencies of operation and higher cycle latencies since the single-port memories are accessed sequentially in time. Multiport memories using time-multiplexing typically have a layout area that is comparable to the size of the layout area of single port. Thus, time-multiplexed memories often use a similar amount of area as, offer half the performance of, and consume a similar amount of the power of a single-port memory.

A third approach for implementing multiport memories provides using first and second inputs ports as well as using first and second output ports for a single bitcell such as an "8T" (eight-transistor) bitcell. The multiple-input and multiple-output memories often use twice the area of, offer less performance than, and consume more power than a single-port memory.

SUMMARY

The problems noted above are solved in large part by a multiport memory emulator that receives a first and a second memory command for concurrent processing of memory commands in one operation clock cycle. Concurrent processing of both read and write commands is supported by a two-level architecture when the command types of the first and second memory commands are both read command types, are both write command types, or are both different command types. Data operands are stored in a memory array of bitcells that is arranged as rows and memory banks An auxiliary memory bank provides a bitcell for physically storing an additional word for each row. The bank address portion of each of the first and second memory commands is respectively translated into a first and second physical bank address. The second physical bank address is assigned a bank address of a bank that is currently unused in response to a determination that the bank address portions are equal and the bank associated with the first bank address is designated as a currently unused bank for subsequently received memory commands in response to the determination that the bank address portions are equal.

BRIEF DESCRIPTION OF THE DRAWINGS

FIG. 3 is a logic diagram illustrating the physical banks of a single-port memory of a logically addressed multiport memory emulator in accordance with embodiments of the disclosure;

FIG. 9 is a logic diagram illustrating the physical banks and an encoded data bank of a single-port memory of a multiport memory emulator for simultaneously processing parallel read operations from the same bank in accordance with embodiments of the disclosure;

FIG. 11 is a logic diagram illustrating the physical banks and an encoded data bank of a single-port memory of another multiport memory emulator for simultaneously processing parallel read operations from the same bank in accordance with embodiments of the disclosure;

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "concurrently" means overlapping, which includes simultaneous and nearly simultaneous events, such as events occurring within (or overlapping with) a current operation cycle.

Figure 1:
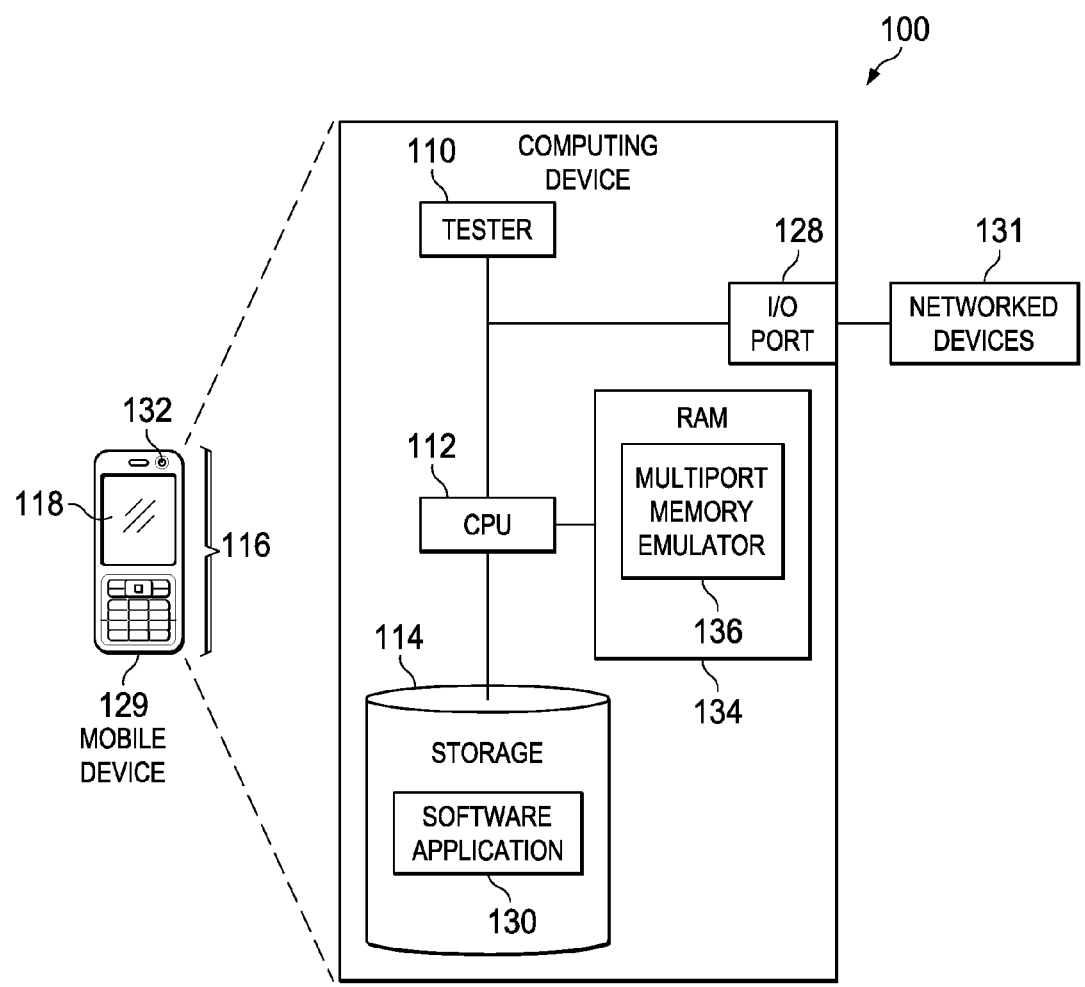
FIG. 1 shows an illustrative computing device in accordance with embodiments of the disclosure.

FIG. 1 shows an illustrative computing device 100 in accordance with embodiments of the disclosure. For example, the computing device 100 is, or is incorporated into a computing device such as a mobile device 129, a personal digital assistant (e.g., a BLACKBERRY® device), a personal computer, automotive electronics, projection (and/or media-playback) unit, or any other type of electronic system using electronic memory.

In some embodiments, the computing device 100 comprises a megacell or a system-on-chip (SoC) which includes control logic such as a tester 110, a CPU 112 (Central Processing Unit), and a storage 114. The CPU 112 can be, for example, a CISC-type (Complex Instruction Set Computer) CPU, RISC-type CPU (Reduced Instruction Set Computer), or a digital signal processor (DSP). The storage 114 (which can be memory such as on-processor cache, off-processor cache, random access memory, flash memory, or disk storage) stores one or more software applications 130 (e.g., embedded applications) that, when executed by the CPU 112, perform any suitable function associated with the computing device 100. The CPU 112 can include (or be coupled to) RAM (random access memory) 134, which can be static or dynamic RAM arranged in a common (or separate) substrate. RAM 134 includes a multiport memory emulator 136 that is used to emulate multiport memories by using, inter alia, single-port memories as disclosed herein below.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the component(s) would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

The multiport memory emulator 136 is arranged to emulate multiport memories by using a lookup table to translate logical addresses into physical addresses for selecting bitcells. The multiport memory emulator 136 provides the performance of multiport memory operation while maintaining a minimal impact on area, the frequency of operation, and power consumption. Thus, the multiport memory emulator 136 can be arranged as large (or small) multiport memories having with an area and frequency of operation close to those of single port memories.

Figure 2:
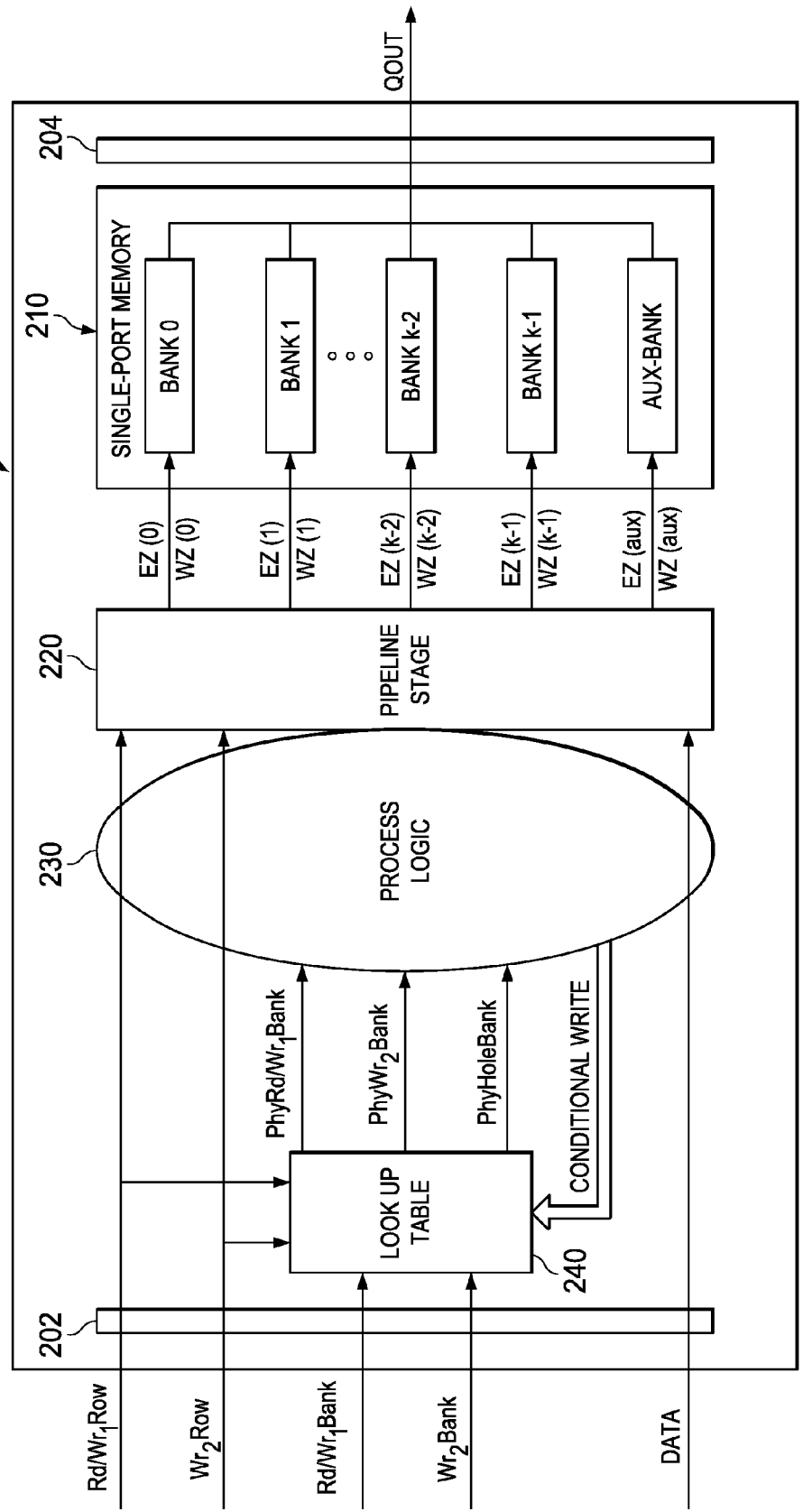
FIG. 2 is a logic diagram illustrating a logically addressed multiport memory emulator in accordance with embodiments of the disclosure.

FIG. 2 is a logic diagram illustrating a logically addressed multiport memory emulator 200 in accordance with embodiments of the disclosure. Multiport memory emulator 200 is dual-port memory emulator and thus is an example of the multiport memory emulator 136 described above (which is arranged having two or more ports). Multiport memory emulator 200 includes an input buffer 202 that is arranged to receive two memory commands (for example, such as two memory commands for a dual-port memory emulator). The two memory commands provide data and a first and second logical address for addressing memory within emulator single-port memory 210. The memory is arranged to concurrently process the first and second memory commands in response to the asserted row portions of the first and second memory commands and the asserted first and second physical bank addresses. Each of the memory commands is associated with a command type, such as a "read operation" or a "write operation."

Figure 4:
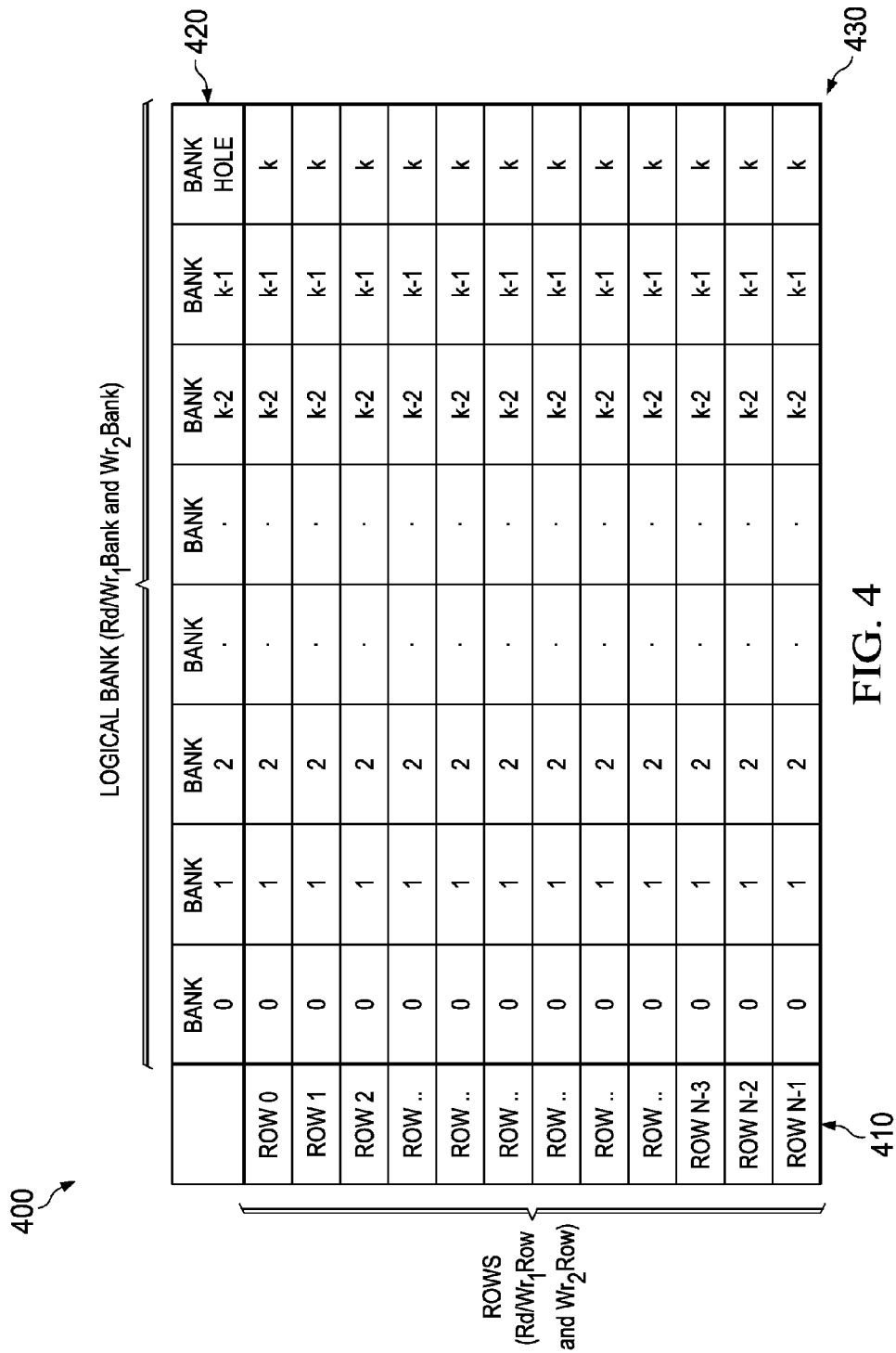
FIG. 4 is a logic diagram illustrating a lookup table for an logically addressed emulator single-port memory array in accordance with embodiments of the disclosure.

Single-port memory (device) 210 is arranged as banks of rows of memory (see, FIG. 4, for example). An auxiliary bank is provided to provide an initial "hole" (e.g., an open memory word at a memory location that is not currently associated with a logical address) that is used to provide relatively immediate access to memory for the second memory operation. (Additional holes are provided for additional ports in embodiments of three-or-more-port memory emulators.)

Each bank is selected in response to an, albeit indirect, bank portion of a received address of each of the received memory commands. A row within each bank is selected in response to a row portion of a received address of each of the received memory commands. Emulator single-port memory 210 is coupled to an output buffer 204 that is arranged to output the data of the selected row and bank of emulator single-port memory 210.

Pipeline stage 220 is coupled to emulator single-port memory 210 and is arranged to provide signals for selecting banks and rows of the emulator single-port memory 210 in response to the received memory commands. More particularly, pipeline stage 220 is arranged to assert the row portions of the first and second memory commands and assert the first and second physical bank addresses. For example, pipeline stage 220 is arranged to pipeline enable signals and write signals for operations for processing each memory command by sequentially asserting the row and bank address for a first memory operation followed by the row and bank address for the second memory operation.

Enable signals EZ(0), EZ(1), . . . , EZ(k−2), EZ(k−1), and EZ(aux) are provided to enable a row and a physical bank that are selected in response to the row portion of the received address for a memory operation and an indirection (e.g., logical to physical translation by lookup table) of the bank portion of the received address for a memory operation. Enable signals are first asserted for the first memory operation, and then are secondly asserted for the second memory operation (discussed below with reference to FIG. 5).

Write signals WZ(0), WZ(1), . . . , WZ(k−2), WZ(k−1), and WZ(aux) are provided when a write operation is indicated. When a write operation is indicated, a row and a physical bank that are selected in response to the row portion of the received address for a write memory operation and an indirection (e.g., logical to physical translation by lookup table) of the bank portion of the received address for a memory operation. In the disclosed embodiment the two received memory commands are write commands or the two received memory commands are a read and a write command.

Process logic (unit) 230 is arranged to receive the row address portions of the received memory commands and to receive the physical bank signals as output by the lookup table 240 (as a translation from a logical address to a physical address). In response to the received signals, the process logic 230 is arranged to provide signals that are adapted to drive the pipeline stage 220, as well as to provide a "conditional write" signal to the lookup table 240.

Lookup table 240 is arranged to receive the bank portion of a received address of each of the received memory commands and the row portion of the received address of each of the received memory commands. The lookup table 240 is arranged to select a physical bank (including the auxiliary bank for providing an initial "hole") of the emulator single-port memory 210 in response to the received signals.

Lookup table 240 is arranged to determine whether the bank address portion of the first memory command is equal to the bank address portion of the second memory command and to translate the bank address portion of each of the first and second memory commands respectively into a first and second physical bank address. In response to the determination that the bank address portions are equal, Lookup table 240 is arranged to assign a bank address of a bank that is currently unused to the second physical bank address and to designate the bank associated with the first bank address as a currently unused bank for subsequently received memory commands.

FIG. 3 is a logic diagram illustrating the logically addressed physical banks of a single-port memory of a multiport memory emulator in accordance with embodiments of the disclosure. Physical banks 300 are used to form an array of memory that includes a main memory 310 and an auxiliary memory 320. The memory array is arranged as rows and memory banks, where each memory bank has an associated bank address and is arranged to physically store one word from each row. Likewise wherein each row has an associated row address and is arranged to physically store one word from each memory bank. The memory array includes an auxiliary memory bank that is arranged to provide a bitcell for physically storing an additional word for each row Main memory 310 includes a total of "k" banks, where the main memory 310 includes a first bank 312 of single-port memories SP(0), intermediate banks of single-port memories (not shown for clarity of illustration), and a terminal bank 314 of single-port memories SP(k−1). Auxiliary memory 320 includes a single bank 322 of single-port memories SP(k). The single bank 322 of single-port memories SP(k) is normally organized in a similar fashion to the banks of main memory 310.

Banks 312, 314, and 322 (for example) are organized as words (where each word is illustrated as a rectangular cell) that each include a series of single-port memories (e.g., bitcells) that is "m" bits long. For example, a word can be a byte, 16-, 32-, 64-bit word, or any other length of single-port memories that is suited for an application. Accordingly, each word in a memory bank is used to store, for example, a data operand associated with one of the received memory commands.

Each bank 312, 314, or 322 (for example) includes an "n" number of the words (as illustrated in a vertical column). Thus the number of single-port memories in a bank is n×m, the number of single-port memories in the main memory 310 is n×m×k, and the number of single-port memories in the main memory 310 and the auxiliary memory 320 is n×m×(k+1). (In three-or-more-port memories, additional auxiliary banks are used, as described above.) The size of lookup table (such as lookup table 240 where each entry is an address that points to a physical bank in the table) is n×log$_2$(k+1)×(k+1).

FIG. 4 is a logic diagram illustrating a lookup table 400 for a logically addressed emulator single-port memory in accordance with embodiments of the disclosure. Lookup table 400 includes a table 430 of rows and banks of words of single-port memories. Table 430 is initialized such that each physical bank entry of the (non-auxiliary banks) is the same as the logical address (e.g., such that the lookup table function returns a value that points to the same physical address that is the same as the logical address of input). Table 430 includes "N" rows (e.g., row 0 through row N−1) and is indexed as illustrated by row indices 410. Table 430 also includes "k+1" banks (e.g., bank 0 through bank k−1, and bank "hole") and is indexed as illustrated by bank indices 420. Thus, the bank address portion of the received memory command is arranged to uniquely address each of the non-auxiliary memory banks.

In the illustrated embodiment, two memory commands are received. A first received command is either a read or a write (Rd/Wr$_1$) command, while a second received command is a write (Wr$_2$) command. Addresses that are associated with each command are partitioned into rows and banks such that the selected row and bank for the first command are respectively Rd/Wr$_1$Row and Rd/Wr$_1$Bank and such that the selected row and bank for the second command are respectively Wr$_2$ Row and Wr2Bank.

As noted above, the physical bank address that is used to select a bank is determined by, for example, using a portion of the received memory command as a logical index to the lookup table, and reading a physical address in response. The lookup table is updated in response to a bank conflict, for example, when a read command and a write command "try" to access the same bank and row at the same time.

When the first command is a read command, the read command is given priority (and is thus considered as the "first" command even though the two commands are concurrently processed). When a bank conflict is determined, the data is read from the selected word (as selected by the selected row and bank); however, the data for the second command is written into an empty location ("hole," which is initially provided by the auxiliary bank) and the lookup table is appropriately updated (as discussed below).

Figure 5:
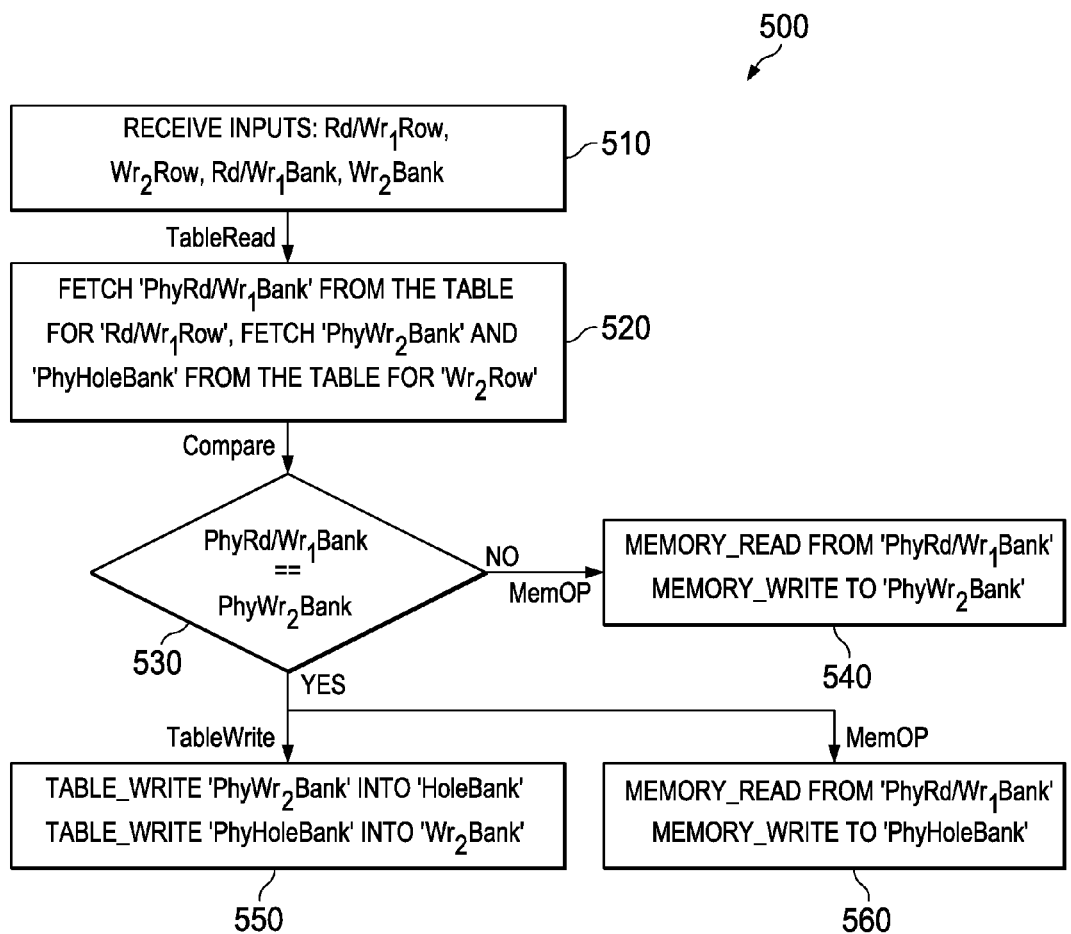
FIG. 5 is a flow diagram illustrating a process for concurrently accessing two ports of a logically addressed multiport memory emulator in accordance with embodiments of the disclosure.

FIG. 5 is a flow diagram illustrating a process for concurrently accessing two ports of a logically addressed multiport memory emulator in accordance with embodiments of the disclosure. Process 500 is initiated in operation 510 when the inputs Rd/Wr$_1$Row, Wr$_2$ Row, Rd/Wr$_1$Bank, and Wr2Bank are received in association with the two received memory commands.

The input WrRow element is the row number of the location that is being written, while the RdRow element is the row number of the location that is being read. A "hole" is (for example) any unused or blank row in a bank (note: the location of the hole for each row moves around in the row as the row in the table is updated). At any time, the total number of available holes in the table is equal to "n" (e.g., the number of rows per bank). For each row: the RdBank is the logical bank that is implicated by a read command generated by a user process, the WrBank is the logical bank that is implicated by a write command generated by a user process, the PhyRdBank is the physical bank that is to be read to retrieve the required data, and the PhyWrBank is the physical bank in which the required data is written when there is no physical bank conflict.

Accordingly, RdBank and WrBank are indexed using a value that ranges from 0 through (k−1), and PhyRdBank and PhyWrBank are indexed using a value that ranges from 0 through k (where "k" is an auxiliary bank that is not necessarily visible to the user or users issuing either of the received commands).

In operation 520, a lookup table read (TableRead) operation is used to determine (e.g., fetch) the value of PhyRd/WR$_1$Bank (in response to Rd/Wr$_1$Row), the value of PhyWr$_2$Bank (in response to Wr$_2$ Row), and the value of PhyHoleBank (in response to Wr$_2$ Row). (See outputs of lookup table 214 in FIG. 2, for example.) Thus, the operation of Table (RdBank) returns PhyRdBank, the operation of Table (WrBank) returns PhyWrBank, and the operation of Table (HoleBank) returns PhyHoleBank (which is the current physical location of the hole for the selected bank).

In operation 530, the physical bank addresses (PhyRd/WR$_1$Bank and PhyWr$_2$Bank) are compared to determine whether the same physical bank is implicated by both the first and the second received memory command. If the same physical bank is not implicated by both the first and the second received memory command (NO), process flow continues with operation 540. If the same physical bank is implicated by both the first and the second received memory command (YES), process flow continues with both operations 550 and 560.

In operation 540, memory operations are performed using differing banks. In the example, a memory read operation is performed using PhyRd/WR$_1$Bank and a memory write operation is performed using PhyWr$_2$Bank. Process flow terminates until the next two memory commands are received. (The case where the two commands are write operations to different banks is not illustrated.)

In operations 550 and 560, memory operations are (typically concurrently) performed using differing physical banks (notwithstanding the fact that the same logical bank is implicated by both received memory commands). Process flow continues until operations of both operations 550 and 560 finishes, and the process flow terminates until the next two memory commands are received.

Operation 550 is a table write operation where the data of the second command (which is a write command) is written into the current hole in the selected row. The pointers (in the lookup table) to the current hole and the PhyWr$_2$Bank are swapped by such that the physical location holding the data just read (and being effectively overwritten by the concurrent write to the same logical address) becomes the new hole. (An example of the swap operation is illustrated below with respect to FIG. 6 and FIG. 7.) Thus, a table write operation moves the value of PhyWr$_2$Bank (e.g., the pointer to the physical bank of the current hole), into "HoleBank" and the value of the PhyHoleBank (e.g., the pointer to the next hole) is moved into the bank pointed to by Wr$_2$Bank.

Operation 560 is a memory-related operation where the data implicated by the first memory command is read using the conflicted bank address (e.g., read from PhyRd/WR$_1$Bank) and the data provided for the second memory command is concurrently written to the hole (e.g., written to the physical memory location pointed to by PhyHoleBank). Thus, both the read and the write to the same logical address are accomplished without time multiplexing, space multiplexing, or providing multiports for each bitcell. As larger memory arrays are used in the multiport memory emulator, the size of the footprint area required by the lookup table (merely) increases at a $\log_2$ rate, and thus becomes vanishingly smaller in proportion to the sizes of ever-larger memory arrays.

Figure 6:
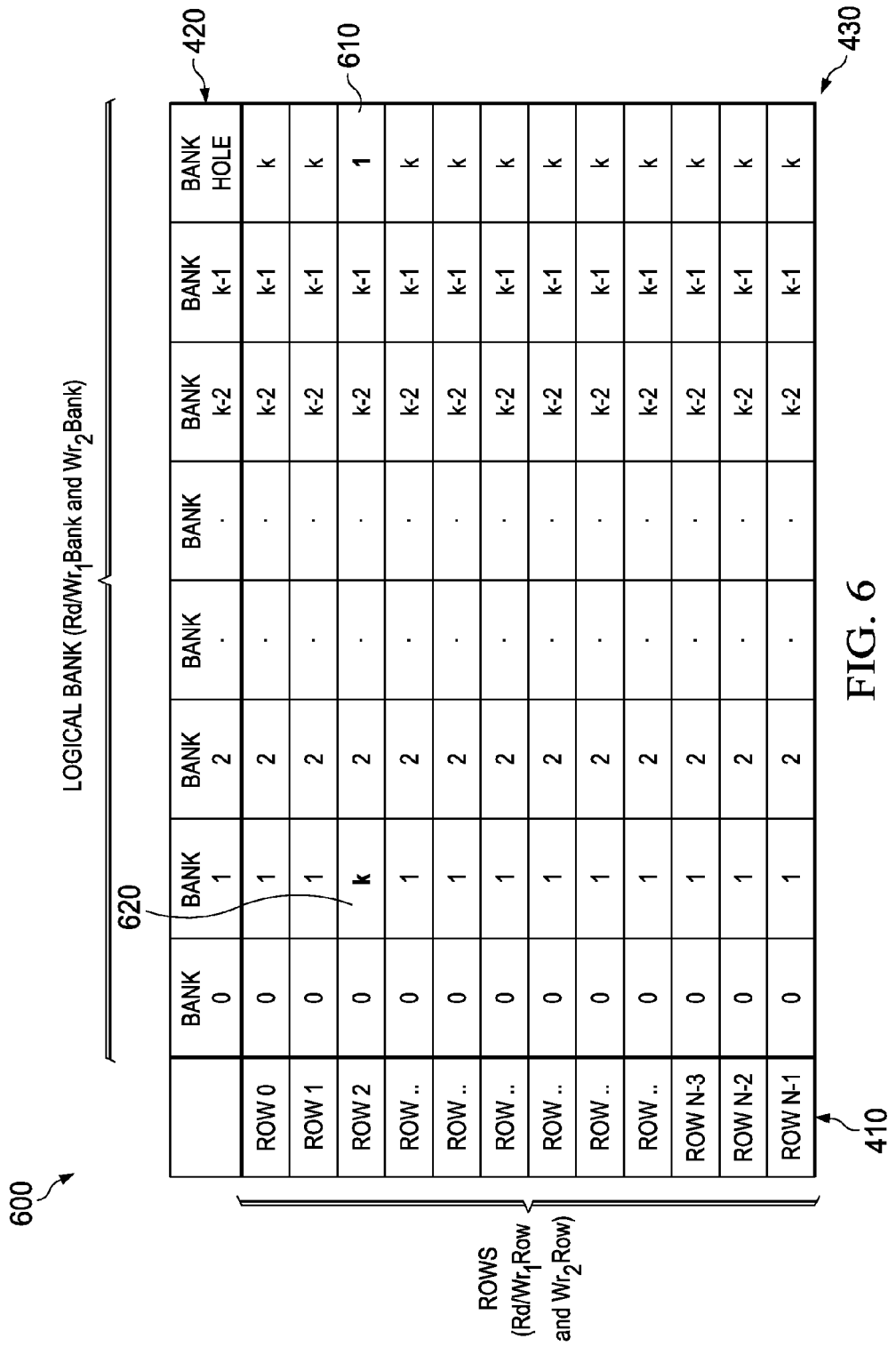
FIG. 6 is a logic diagram illustrating the state of a lookup table of an logically addressed emulator single-port memory array after a first update to the logic table in accordance with embodiments of the disclosure.

FIG. 6 is a logic diagram illustrating the state of a lookup table of a logically addressed emulator single-port memory array after a first update to the logic table in accordance with embodiments of the disclosure. Before the first update is applied to table 430, table 430 is initialized as illustrated in FIG. 4. Two commands for concurrent access to the emulator single-port memory array are received that implicate the same memory bank (e.g., bank "1" in the illustrated table). Thus, the first command is initiated for reading from the implicated bank, and a second command is initiated for concurrently writing data to a "new" physical location (e.g., the hole in the bank). Accordingly, the table is updated to logically point to the "new" physical location.

A "swap" operation is used to update the lookup table to point to the most-recently stored data and to "free up" the "stale" data of the location most-recently read from. The pointer to the current hole and the pointer to the PhyWr$_2$Bank are swapped by such that the physical location holding the data just read becomes the new hole. Thus, a table write operation moves the value of PhyWr$_2$Bank (e.g., "k," which is the physical bank of the newly stored data and the "old" hole), into "HoleBank" at location 620 and the value of the Phy-HoleBank (e.g., "1," which is the physical bank of the new hole) is moved into the bank pointed to by Wr$_2$Bank at location 610.

Figure 7:
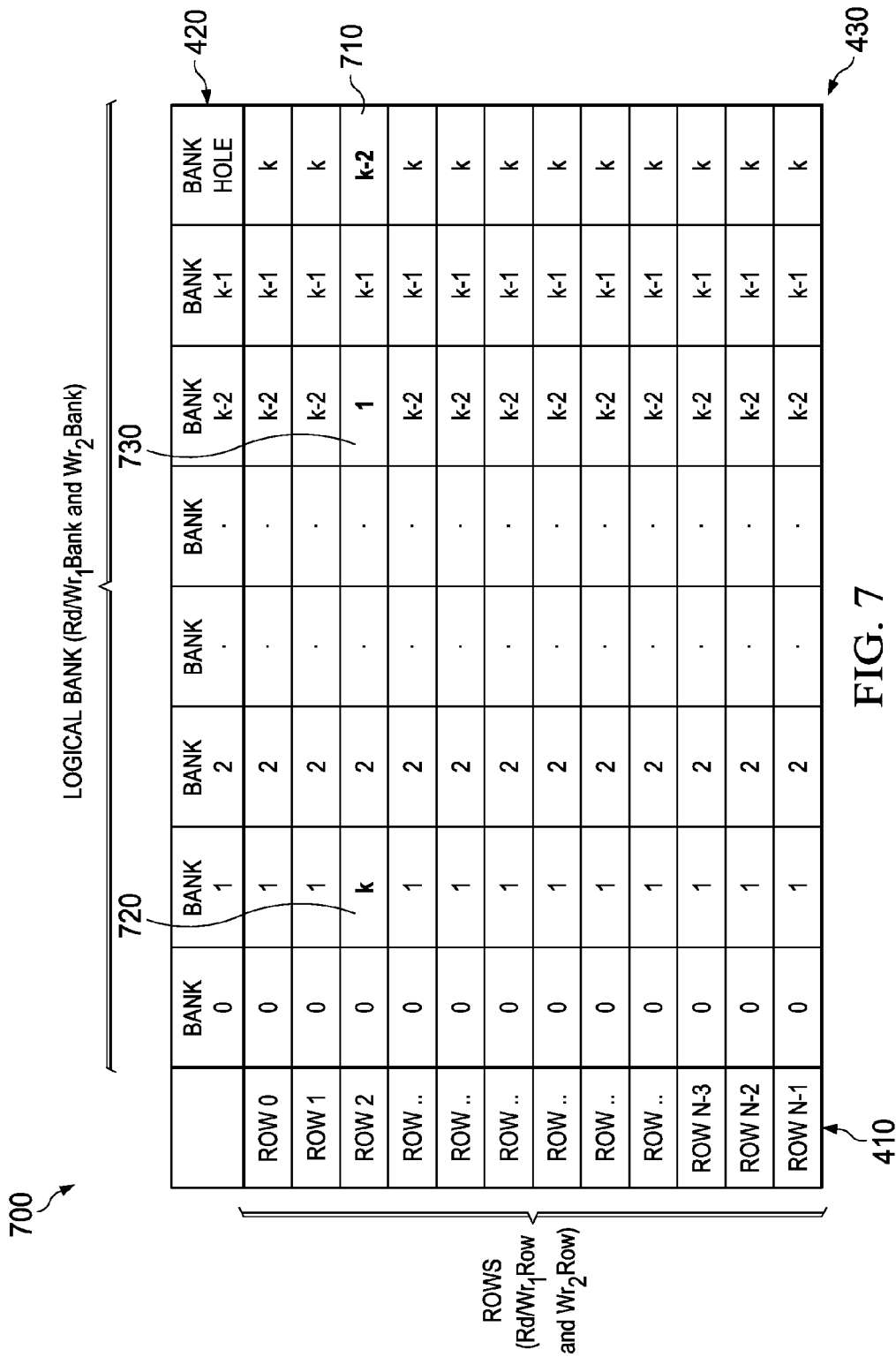
FIG. 7 is a logic diagram illustrating the state of a lookup table of an logically addressed emulator single-port memory array after a second update to the logic table in accordance with embodiments of the disclosure.

FIG. 7 is a logic diagram illustrating the state of a lookup table of a logically addressed emulator single-port memory array after a second update to the logic table in accordance with embodiments of the disclosure. Before the second update is applied to table 430, the state of table 430 is as illustrated in FIG. 6. In order for the second update of the table to be initiated, two commands for concurrent access to the emulator single-port memory array are received that implicate the same memory bank. In the example, the first command is initiated for reading from the implicated bank, and a second command is initiated for concurrently writing data to a "new" physical location. Accordingly, the table is to be updated to logically point to the "new" physical location A "swap" operation is also used in performing the second update of the lookup table. The pointer to the current hole and the pointer to the PhyWr$_2$Bank are swapped by such that the physical location holding the data just read becomes the new hole. Thus, a table write operation moves the value of PhyWr$_2$Bank (e.g., "1," which is the physical bank of the newly stored data and the "old" hole), into "HoleBank" at location 720 and the value of the PhyHoleBank (e.g., "k–2," which is the physical bank of the new hole) is moved into the bank pointed to by Wr$_2$Bank at location 710. Location 730 remains undisturbed as the bank "1" was not implicated as a logical address in the received memory commands that initiated the second lookup table update.

Figure 8:
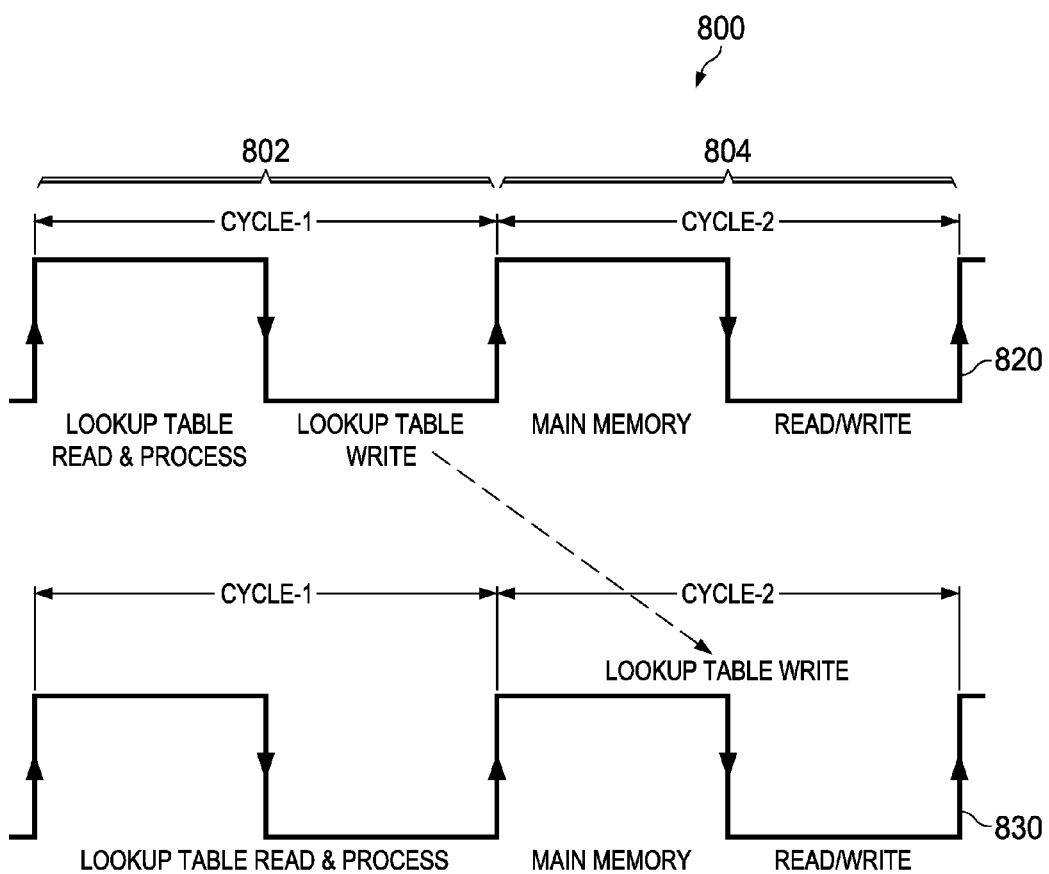
FIG. 8 is a timing diagram that illustrates access cycles of a logically addressed multiport memory emulator in accordance with embodiments of the disclosure.

FIG. 8 is a timing diagram that illustrates access cycles of a logically addressed multiport memory emulator in accordance with embodiments of the disclosure. Waveforms 800 include a first cycle 802 and a second cycle 804, wherein each cycle has a first portion and a second portion. Generally, three operations performed during the first cycle 802 and a second cycle 804 include the functions of a "lookup table read and process," "lookup table write" (e.g., for updating the lookup table), and "main memory read/write."

Waveform 820 illustrates a timing of the functions when relatively slower clock speeds are encountered in an application of the multiport memory emulator. Waveform 820 illustrates the "lookup table read and process" function occurs during the first portion of the first cycle 802, the "lookup table write" function occurs during the second portion of the first cycle 802, and the "main memory read/write" function occurs during the second cycle 804.

Waveform 830 illustrates a timing of the functions when relatively higher clock speeds are encountered in an application of the multiport memory emulator (and tighter timing requirements for the first cycle are encountered). Waveform 830 illustrates the "lookup table read and process" function occurs during the first cycle 802, the "lookup table write" function occurs concurrently with the "main memory read/write" function during the second cycle 804. Thus, an operation clock cycle includes the first cycle 802 and the second cycle 804 and is the effective sustainable rate at which at least one memory operation can be performed.

FIG. 9 is a logic diagram illustrating the physical banks and an encoded data bank of a single-port memory of a multiport memory emulator for simultaneously processing parallel read operations from the same bank in accordance with embodiments of the disclosure. Encoded memory system 900 is used to form an array of memory that includes a main memory 910 and an encoded data memory bank 920. The memory array is arranged as rows and memory banks, where each memory bank has an associated bank address and is arranged to physically store one word from each row. Likewise each row has an associated row address and is arranged to physically store one word from each memory bank. The memory array includes encoded data memory bank 920 that is arranged to provide read and write storage for physically storing an encoded representation of the data for each row of words in each memory bank.

Main memory 910 includes a total of "k" banks, where the main memory 910 includes a first bank 912 of single-port memories SP(0), intermediate banks of single-port memories (not shown for clarity of illustration), and a terminal bank 914 of single-port memories SP(k−1).

Encoded data memory bank 920 includes a single bank 922 of single-port memories D$_0$ through D$0_{n-1}$, where "n" is the number of rows. The single bank 922 of single-port memories SP(k) is organized in a similar fashion to the banks of main memory 910.

Banks 912, 914, and 922 (for example) are organized as including words (where each word is illustrated as a rectangular cell) that each include a series of single-port memories (e.g., bitcells) that is "m" bits long. For example, a word can be a byte, 16-, 32-, 64-bit word, or any other length of single-port memories that is suited for an application and processor data width. Accordingly, each word in a memory bank is used to store, for example, a data operand associated with one of the received memory commands.

Each bank 912, 914, or 922 (for example) includes an "n" number of the words (where each bank is illustrated as a vertical column). Thus the number of single-port memories in a bank is n×m, the number of single-port memories in the main memory 910 is n×m×k, and the number of single-port memories in the main memory 910 and the encoded data memory bank 920 is n×m×l. (In three-or-more-port memories, additional auxiliary banks are used, as described above.)

The data stored in the encoded data memory bank 922 is an encoded value encoded using Eq. 1 for each stored memory element M$_{x,y}$ in a row, where "y" is a row number and "x" is a bank number and function "f" is a function described as Eq. 3 below:

$$D_y = f(M_{0,y}, M_{1,y}, \ldots, M_{k-1,y}) \quad (1)$$

A stored memory element M$_{x,y}$ is determined (without actually reading the stored value for the referenced data element in main memory 910) by using Eq. 2 as an inverse function of the data stored in the set of data elements in a row (wherein the set excludes the referenced data element) and the encoded data stored in the encoded data memory bank 920.

$$M_{x,y} = f^{-1}(M_{0,y}, M_{1,y}, \ldots, M_{(x-1),y}, M_{(x+1),y}, \ldots, M_{k,y}, M_{D,y}) \quad (2)$$

The inverse function "f$^{-1}$" and the function "f" are both the exclusive-OR (XOR) function as described in Eq. 3:

$$f = f^{-1} = \oplus \quad (3)$$

Use of the XOR function avoids using, for example, different functions such as addition to determine an encoded word for row data, and subtraction (as the inverse function) to decode the decoded word to determine a word in the row (without having to read the row element directly). The wider operands and wider adders/subtracters (and the corresponding increases in layout area and power consumption for implementation) are also avoided by using the XOR function for both the coding and decoding functions.

Accordingly, XOR encoding logic (XOR ENC LOGIC) 970 unit is used for both coding and decoding for read operands. XOR encoding logic unit 970 unit performs an encoding operation when storing information in encoded data memory bank 922. XOR encoding logic unit 970 unit performs a decoding operation when determining a second read operand when parallel (e.g., concurrent) read commands are received.

In operation, each write to the data contents of main memory 910 of physical banks 900 results in an encoding operation of which the results are stored in the encoded data memory 920. For example, a write command 930 for writing a "d2" operand to a memory location addressed by row "r7" and bank "b5" results in a read operation 940 where the present (e.g., current) data operand "d1" is read from the row "r7" and bank "b5" address and a read operation 950 where the data operand "d4" is read from row "r7" of the encoded data memory bank 922.

XOR encoding logic unit 970 unit performs an encoding operation on data operands when storing information in encoded data memory bank 922. For example, a previously (if any) encoded "d4" operand is read from row "r7" in encoded data memory bank 922 in a read operation 950. XOR encoding logic unit 970 unit performs an encoding operation by performing the XOR operation on data operands "d1," "d2," and "d4." The result of the XOR operation is written back to the row "r7" memory location in encoded data memory bank 922 during write operation 960.

Figure 10:
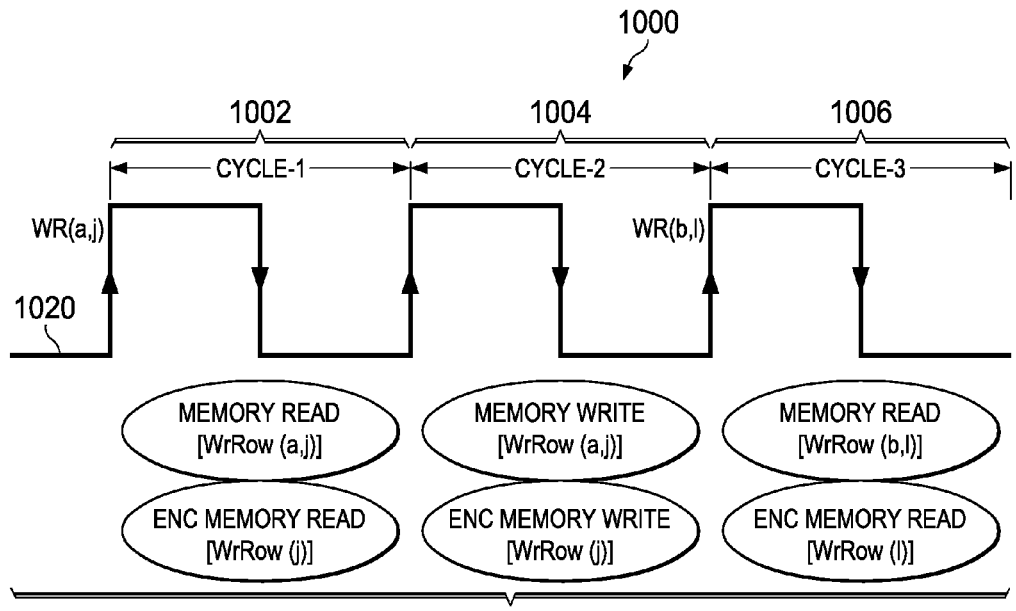
FIG. 10 is a timing diagram that illustrates the memory operations of FIG. 9 in accordance with embodiments of the disclosure.

FIG. 10 is a timing diagram that illustrates the memory operations of FIG. 9 in accordance with embodiments of the disclosure. Waveform diagram 1000 illustrates a waveform 1020 having a first cycle 1002, a second cycle 1004, and a third cycle 1006. Waveform 1020 illustrates a "memory read [WrRow(a,j)]" operation (cf. operation 940) occurs during the first cycle 1002, where "a" is the selected bank and "j" is the selected row number. Likewise "encoded memory read [WrRow(j)]" operation (cf. operation 950) occurs during the first cycle 1002, where "j" is the selected row number.

During the second cycle 1004, waveform 1020 illustrates the "memory write[WrRow(a,j)]" operation (cf. operation 930) occurs during the first portion of the second cycle 1004. Likewise "encoded memory write[WrRow(j)]" operation (cf. operation 960) occurs during the second cycle 1004, where "j" is the selected row number. Because the XOR operation occurs during the second cycle 1004, the single-ports of each memory word are modified to perform a "pre-read" operation so as to make the operand to be written (cf. "d1" of the example in FIG. 9) available as an input to the XOR operation during a first portion of cycle 1004. During a second portion of cycle 1004, the result of the XOR operation (which relies on the operands retrieved from the two memory read operations in cycle 1004 and the previously "pre-read" operand to be written into main memory) is written into the encoded memory.

The WR(a,j) operation (that is initiated at the beginning of the first cycle 1002) is completed before the end of the second cycle 1004. The WR(b,l) operation (which is the next write operation having different operands and addresses) is begun at the start of the third cycle 1006. Thus the WR(a,j) operation is completed in two cycles with no overlap with a following consecutive third cycle. Thus, an operation clock cycle includes the first cycle 1002 and the second cycle 1004 and is the effective sustainable rate at which at least one memory operation can be performed FIG. 11 is a logic diagram illustrating the physical banks and an encoded data bank of a single-port memory of another multiport memory emulator for simultaneously processing parallel read operations from the same bank in accordance with embodiments of the disclosure. Encoded memory system 1100 is used to form an array of memory that includes a main memory 1110 and an encoded data memory bank 1120. The memory array includes encoded data memory bank 1120 that is arranged to provide read and write storage for physically storing an encoded representation of the data for each row of words in each memory bank.

Main memory 1110 includes a total of "k" banks, where the main memory 1110 includes a first bank 1112 of single-port memories SP(0), intermediate banks of single-port memories (not shown for clarity of illustration), and a terminal bank 1114 of single-port memories SP(k−1). Encoded data memory bank 1120 includes a single bank 1122 of single-port memories $D_0$ through $D0_{n-1}$, where "n" is the number of rows. The single bank 1122 of single-port memories SP(k) is normally organized in a similar fashion to the banks of main memory 1110. Banks 1112, 1114, and 1122 (for example) are organized as including words (where each word is illustrated as a rectangular cell) that each include a series of single-port memories (e.g., bitcells) that is "m" bits long. Each bank 1112, 1114, or 1122 (for example) includes an "n" number of the words (as illustrated in a vertical column).

The data stored in the encoded data memory bank 1122 is an encoded value encoded as discussed above using Eq. 1. A stored memory element $M_{x,y}$ is determined by using Eq. 2 as discussed above. The inverse function "$f^{-1}$" and the function "$f$" are both the exclusive-OR (XOR) function as described above in Eq. 3.

Accordingly, XOR encoding logic unit 1170 unit performs an encoding operation when storing information in encoded data memory bank 1122. In operation, each write to the data contents of main memory 1110 of physical banks 1100 results in an encoding operation of which the results are stored in the encoded data memory bank 1122. For example, a write command 1130 for writing a "d2" operand to a memory location addressed by row "r7" and bank "b5" results in a read operation 1140 where the data operand "d*" (e.g., data from rows "r7" of all banks—except the selected bank b5 in main memory 1110) is read from the rows "r7" and bank "b5_*" (e.g., all banks in main memory 1110 except for bank b5, which obviates the need for a simultaneous read to the addressed bank b5) address.

XOR encoding logic unit 1170 unit performs an encoding operation on data operands when storing information in encoded data memory bank 1120. For example, the encoded information is stored in an associated row of the encoded data memory 1120 so the data that would have otherwise been read from a selected row and memory bank can be obtained by decoding the data from the selected row of the encoded memory bank 1120 (as described below with respect to FIG. 13 and FIG. 14). XOR encoding logic unit 1170 unit performs an encoding operation by performing the XOR operation on data operands "d2" (the data operand to be written to a selected row and selected bank) and "d*" (the data operand having each word of each selected row from banks other than the selected bank). The result of the XOR operation is written back to the row "r7" memory location in encoded data memory bank 1122 during write operation 1160. (Physical bank system 1100 consumes more power than the encoded memory system 900 described above, but has a throughput of twice the throughput of the encoded memory system 900 as discussed below with reference to FIG. 12.)

Figure 12:
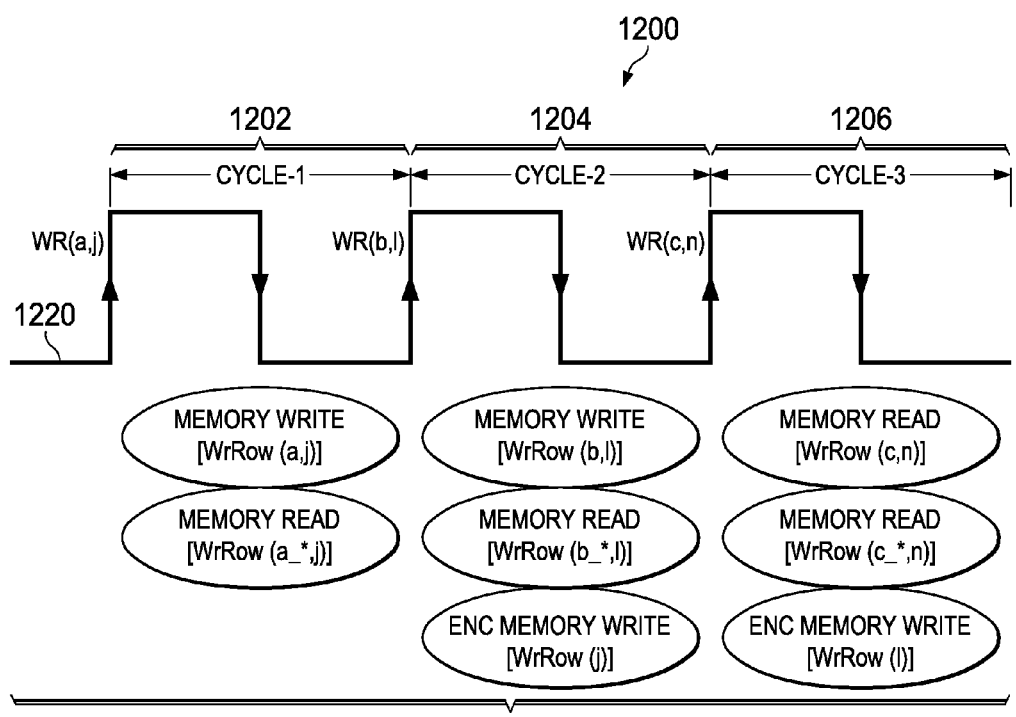
FIG. 12 is a timing diagram that illustrates the memory operations of FIG. 11 in accordance with embodiments of the disclosure.

FIG. 12 is a timing diagram that illustrates the memory operations of FIG. 11 in accordance with embodiments of the disclosure. Waveform diagram 1200 illustrates a waveform 1220 having a first cycle 1202, a second cycle 1204, and a third cycle 1206. Waveform 1220 illustrates a "memory write [WrRow(a,j)]" operation (cf. operation 1140) occurs during the first cycle 1202, where "a" is the selected bank and "j" is the selected row number. Likewise "memory read[WrRow (a_*,j)]" operation (cf. operation 1140) occurs during the first cycle 1202, where "a_*" is the set of banks that excludes bank "a" and "j" is the selected row number.

During the second cycle 1204, waveform 1220 illustrates the "memory write[WrRow(a,j)]" operation (cf. operation 1130) occurs during the first cycle 1202. Likewise "encoded memory write[WrRow(j)]" operation (cf. operation 1160) occurs during the second cycle 1204, where "j" is the selected row number. Because the XOR operation occurs before the end of the second cycle 1204, the single-ports of each memory word are modified to perform a "pre-read" operation so as to make the operand to be written (cf. "d2" of the example in FIG. 11) available as an input to the XOR operation during a second portion of cycle 1202 or a first portion of cycle 1204. During a second portion of cycle 1204, the result of the XOR operation (which relies on the operands retrieved from the two memory read operations in cycle 1204 and the previously "pre-read" operand to be written into main memory) is written into the encoded memory.

The WR(a,j) operation (that is initiated at the beginning of the first cycle 1202) is completed before the end of the second cycle 1204. The WR(b,l) operation (which is the next write operation having different operands and addresses) is begun at the start of the second cycle 1206. Thus the WR(a,j) operation is a pipelined operation that is effectively completed every cycle by performing the encoded memory write operation during a second cycle that overlaps with the first cycle of a second operation. The WR(c,n) operation begins at the third cycle 1206 and is completed by performing the third encoded memory write operation during the fourth cycle (not shown). Thus, an operation clock cycle includes the first cycle 1202 and the second cycle 1204 and is the effective sustainable rate at which at least one memory operation can be performed.

Figure 13:
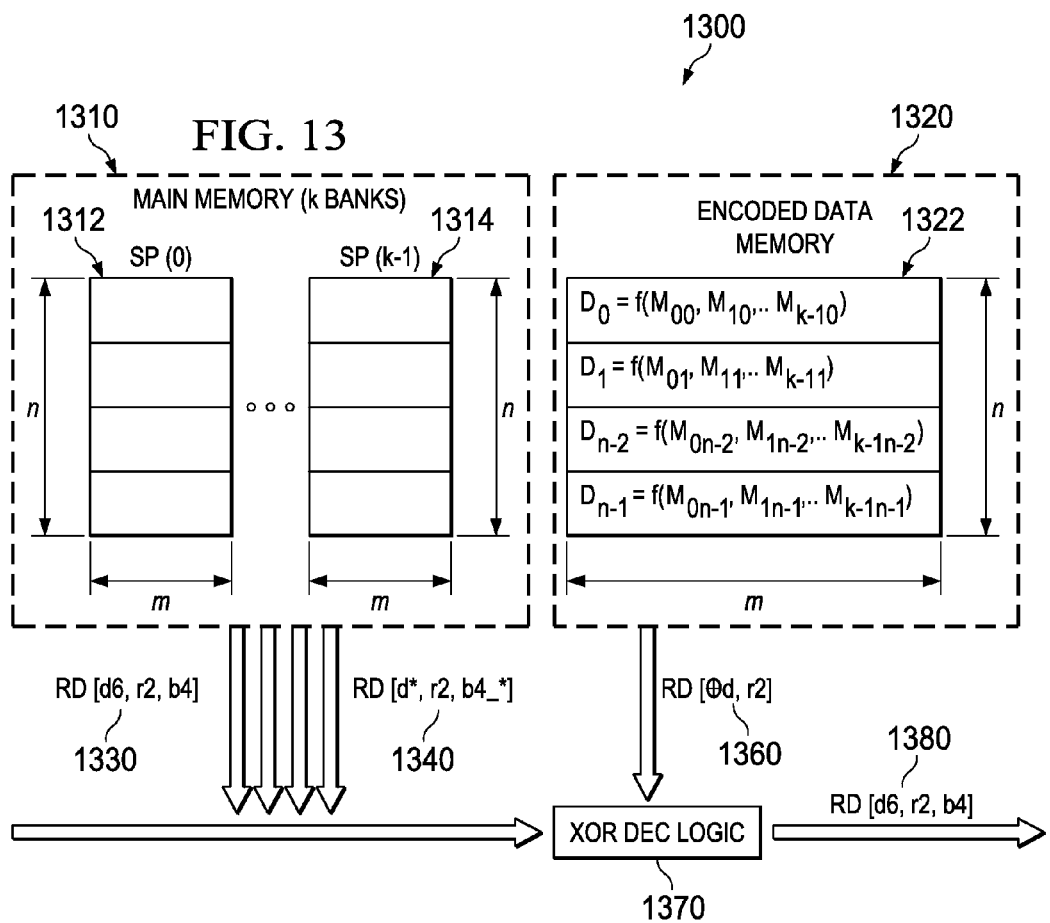
FIG. 13 is a logic diagram illustrating the physical banks and an encoded data bank of a single-port memory of another multiport memory emulator for simultaneously processing parallel read operations from the same bank in accordance with embodiments of the disclosure.

FIG. 13 is a logic diagram illustrating the physical banks and an encoded data bank of a single-port memory of another multiport memory emulator for simultaneously processing parallel read operations from the same bank in accordance with embodiments of the disclosure. Encoded memory system 1300 is used to form an array of memory that includes a main memory 1310 and an encoded data memory bank 1320. The memory array includes encoded data memory bank 1320 that is arranged to provide read and write storage for physically storing an encoded representation of the data for each row of words in each memory bank.

Main memory 1310 includes a total of "k" banks, where the main memory 1310 includes a first bank 1312 of single-port memories SP(0), intermediate banks of single-port memories (not shown for clarity of illustration), and a terminal bank 1314 of single-port memories SP(k−1). Encoded data memory bank 1320 includes a single bank 1322 of single-port memories $D_0$ through $D0_{n-1}$, where "n" is the number of rows. The single bank 1322 of single-port memories SP(k) is normally organized in a similar fashion to the banks of main memory 1310. Banks 1312, 1314, and 1322 (for example) are organized as including words (where each word is illustrated as a rectangular cell) that each include a series of single-port memories (e.g., bitcells) that is "m" bits long. Each bank 1312, 1314, or 1322 (for example) includes an "n" number of the words (as illustrated in a vertical column).

The data stored in the encoded data memory bank 1322 is an encoded value encoded as discussed above using Eq. 1. A stored memory element $M_{x,y}$ is determined by using Eq. 2 as discussed above. The inverse function "$f^{-1}$" and the function "$f$" are both the exclusive-OR (XOR) function as described above in Eq. 3.

Accordingly, XOR decoding logic unit 1370 unit performs a decoding operation (which is the same as the encoding operation by operation of the inverse identity property of the XOR function) when reading information from encoded data memory bank 1322. In operation, each read from the data contents of main memory 1310 of physical banks 1300 results in a decoding operation of the results are stored in the encoded data memory bank 1322. For example, a read command 1330 is received for reading a "d6" operand from a memory location addressed by row "r2" and bank "b4" results in a read operation 1340 where the data operand "d*" (e.g., data from rows "r2" of all banks—except the selected bank b4 in main memory 1310) is read from the rows "r2" and bank "b4_*" (e.g., all banks in main memory 1310 except for bank b54 which obviates the need for a simultaneous read to the addressed bank b4) address.

XOR decoding logic unit 1370 unit performs a decoding operation on data operands when reading information from encoded data memory 1320. For example, the encoded information is stored in an associated row of the encoded data memory bank 1322 so the data that would have otherwise been read from a selected row and memory bank can be obtained by decoding the data from the selected row of the encoded memory bank 1320. XOR decoding logic unit 1370 unit performs a decoding operation by performing the XOR operation on data operand "d*" (the data operand having each word of each selected row from banks other than the selected bank) retrieved during operation 1340 and the encoded memory word "⊕d" stored in the selected row of the encoded memory bank 1322. The result of the XOR operation as the result of the read operation as operand "d6" during read operation 1380.

Figure 14:
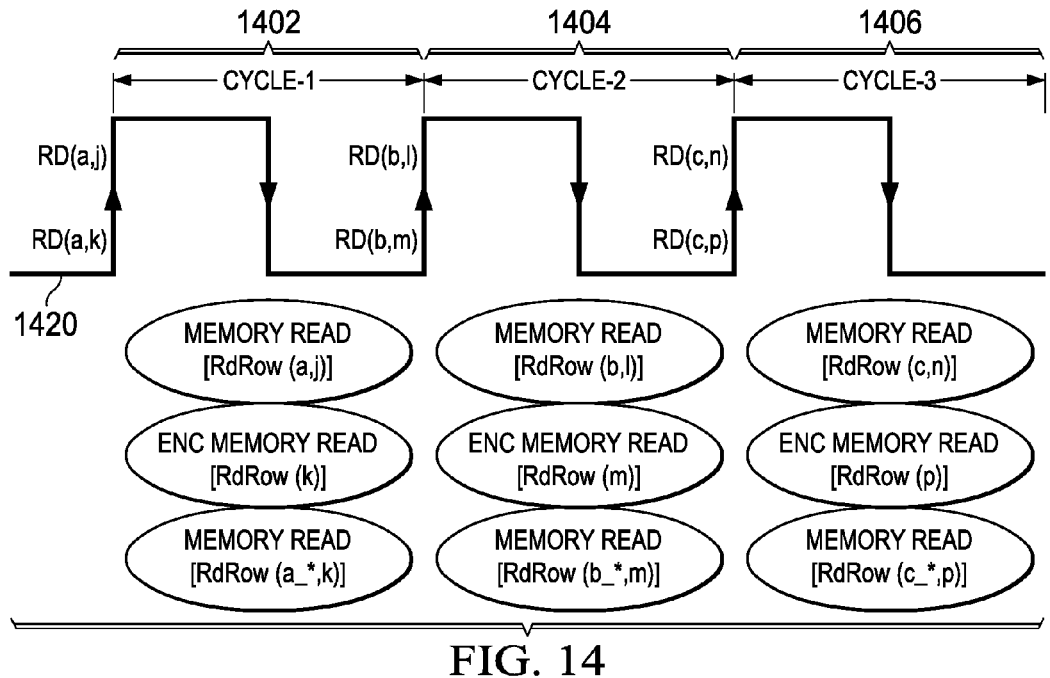
FIG. 14 is a timing diagram that illustrates the memory operations of FIG. 13 in accordance with embodiments of the disclosure.

FIG. 14 is a timing diagram that illustrates the memory operations of FIG. 13 in accordance with embodiments of the disclosure. Waveform diagram 1400 illustrates a waveform 1420 having a first cycle 1402, a second cycle 1404, and a third cycle 1406. Waveform 1420 illustrates a "memory read [RdRow(a,j)]" operation occurs during the first cycle 1402, where "a" is the selected bank and "j" is the selected row number. Likewise a "memory read[RdRow(a_*,k)]" operation (cf. operation 1340) occurs during the first cycle 1402, where "a_*" is the set of banks that excludes bank "a" and "j" is the selected row number. (The "memory read[RdRow(a_*, k)]" operation occurs in response to a second parallel read from the same selected memory bank "a".) Further, the "encoded memory read[RdRow(k)]" operation (cf. operation 1360) occurs during the first cycle 1402, where "k" is the selected row number.

When the memory read[RdRow(a,j)]" operation, the "memory read[RdRow(a_*,k)]" operation, the "encoded memory read[RdRow(k)]" operation, and the XOR operation on the "d*" and the encoded memory word "⊕d" operands are performed during the first cycle 1402, the actual throughput of memory bank system is two reads per cycle. For example, the RD(a,j) operation and the RD(a,k) operation are both completed during the first cycle 1402. The RD(b,l) operation and the RD(b,m) operation are both completed during the second cycle 1404. The RD(c,n) operation and the RD(c,p) operation are both completed during the third cycle 1406. Thus, dual (e.g., overlapping, concurrent, and/or simultaneous) reads are achieved in one clock cycle.

Figure 15:
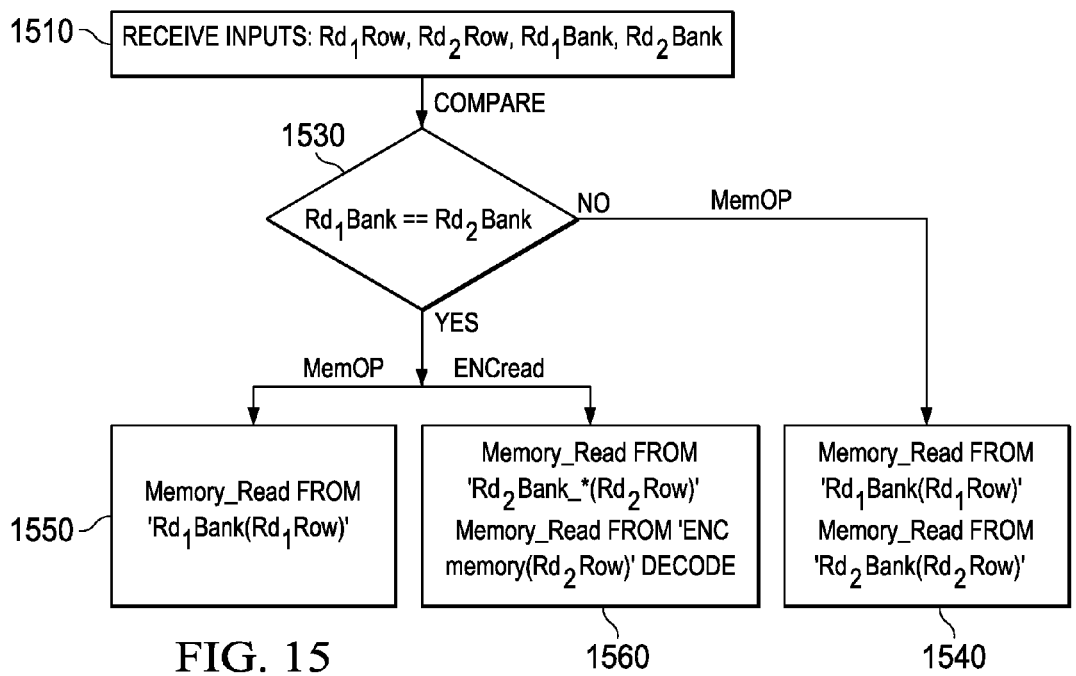
FIG. 15 is a flow diagram illustrating a process for concurrently reading two ports of a logically addressed multiport memory emulator in accordance with embodiments of the disclosure.

FIG. 15 is a flow diagram illustrating a process for concurrently reading two ports of a logically addressed multiport memory emulator in accordance with embodiments of the disclosure. Process 1500 is initiated in operation 1510 when the inputs $Rd_1Row$, $Rd_2Row$, $Rd_1Bank$, and $Rd_2Bank$ are received in association with the two received memory commands. In operation 1530, the physical bank addresses ($Rd_1Bank$, and $Rd_2Bank$) are compared to determine whether the same physical bank is implicated by both the first and the second received read commands. If the same physical bank is not implicated by both the first and the second received memory command (NO), process flow continues with operation 1540. If the same physical bank is implicated by both the first and the second received memory command (YES), process flow continues with both operations 1550 and 1560.

In operation 1540, memory operations are performed using differing banks. In the example, a first memory read operation is performed by reading from $Rd_1Bank(Rd_1Row)$ and a second memory read operation is performed by reading from $Rd_2Bank(Rd_2 Row)$. Process flow terminates until the next two memory commands are received.

In operations 1550 and 1560, memory operations are (typically concurrently) performed using differing physical banks (notwithstanding the fact that the same logical bank is implicated by both received memory commands). Process flow continues until operations of both operations 1550 and 1560 finishes, and the process flow terminates until the next two memory commands are received. In operation 1550, a first memory read operation is performed by reading from $Rd_1Bank(Rd_1Row)$. In operation 1560 an encoded memory read operation is performed by reading from $Rd_2Bank\_*(Rd_2 Row)$ (where "$Rd_2Bank\_*$ is the set of banks that excludes $Rd_2Bank$"), by reading from encoded memory($Rd_2 Row$), and by decoding the results of the operands that are obtained from the from reads from the $Rd_2Bank(Rd_2 Row)$ and encoded memory($Rd_2 Row$) locations.

Figure 16:
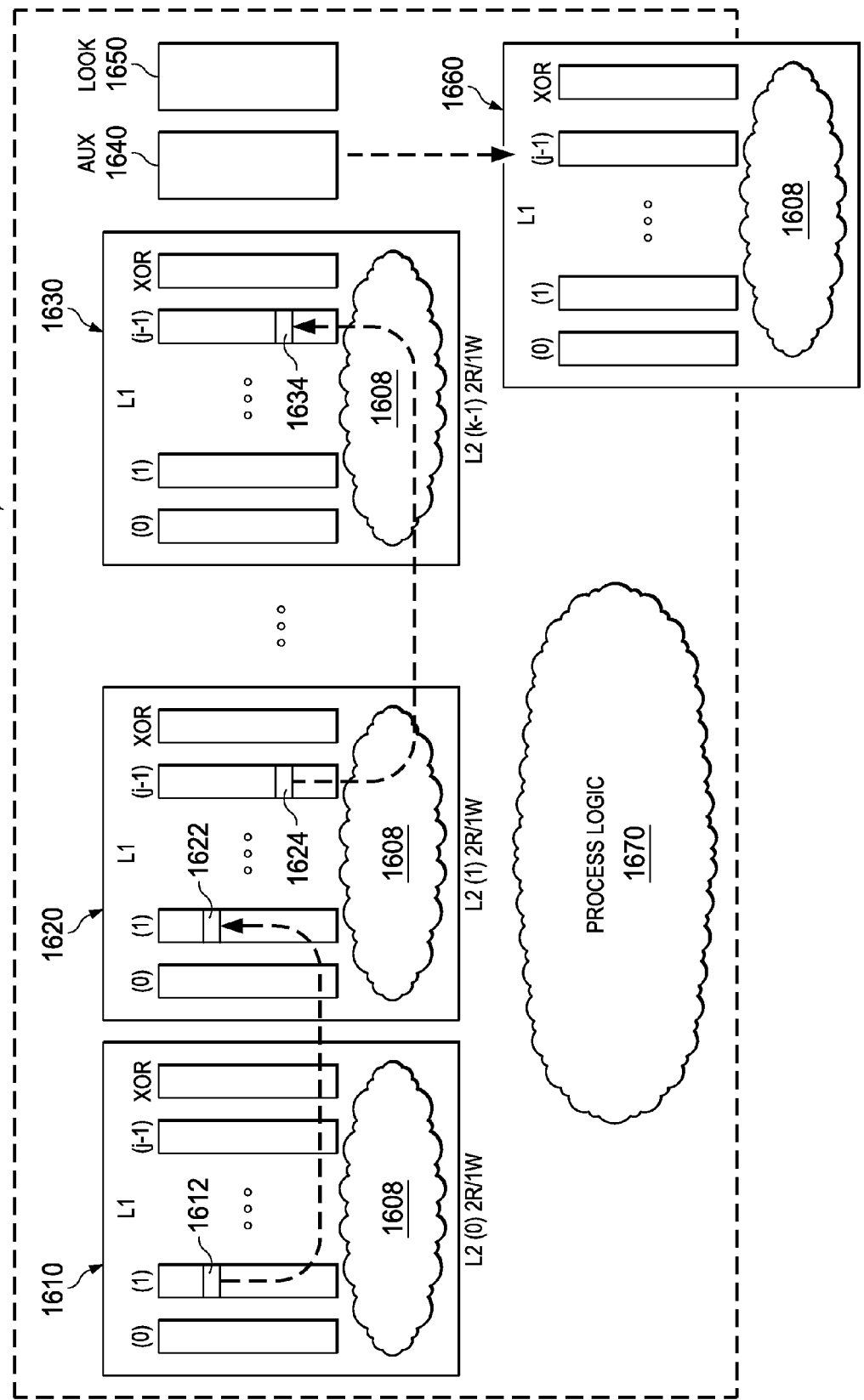
FIG. 16 is a logic diagram that illustrates a full dual read and write architecture multiport memory emulator in accordance with embodiments of the disclosure.

FIG. 16 is a logic diagram that illustrates a full dual read and write architecture multiport memory emulator in accordance with embodiments of the disclosure. Emulator 1600 includes encoded memory systems 1610, 1620, and 1630. Each of the encoded memory systems 1610, 1620, and 1630 is similar to the encoded memory system 900 or 1100 and 1300 and is arranged to perform a read and a write operation simultaneously, as well as perform dual read operations simultaneously (as discussed above with reference to FIG. 15). Thus emulator 1600 includes a main memory (e.g., main memory 310) having a physical address space that is, for example, based on the number of rows and banks in the memory, as well as secondary memory that (when full parallel read and/or write operations are supported) includes the auxiliary memory (e.g., aux memory 320) and encoded memory (e.g., encoded memory data 920).

A process logic 1668 is arranged to perform the encoding and decoding memory functions of each encoded memory system 1610, 1620, 1630, and 1660 ("level one" or "L1"), whereas the process logic 1670 is arranged to perform the encoding and decoding memory functions of emulator 1600 ("level two" or "L2"). At level one, each of the encoded memory system 1610, 1620, and 1630 is arranged as a memory bank in similar fashion to the memory banks as discussed above with reference to FIG. 3. At level two, each of the encoded memory banks forms a memory bank of a logically addressed memory emulator as discussed above (with reference to FIG. 2 for example). In like manner, auxiliary bank (AUX) 1640 is arranged as an encoded memory system 1660 in similar fashion to encoded memory systems 1610, 1620 and, 1630. Lookup table (LOOK) 1650 is similar to lookup table 400 and similarly is arranged to translate logical addresses into physical addresses as well as maintaining the bank position of the "hole" in a row as described above.

Emulator 1600 is arranged to perform a read and a write operation simultaneously, to perform dual write operations simultaneously, and to perform dual read operations simultaneously. For example, each of the level-one encoded memory bank supports simultaneous dual read operations as well as simultaneous read and write operations, whereas the level-two logically addressed memory emulator supports the simultaneous read and write operations as well as simultaneous write operations. Thus, a full dual read and write architecture is achieved.

When dual write operations are performed simultaneously, the "hole" appears to jump across a "block" (e.g., encoded memory system) boundary because the simultaneous write operations are performed at the level-two logically addressed memory emulator. For example, hole 1612 appears to move to hole 1622 during a first pair of simultaneous write operations, whereas hole 1624 appears to move to hole 1634 during a second pair of simultaneous write operations. Accordingly, each hole moves to the same bank number and the same row number in a different block. Accordingly, lookup table 1650 is arranged to also maintain block information that is associated with the hole.

Figure 17:
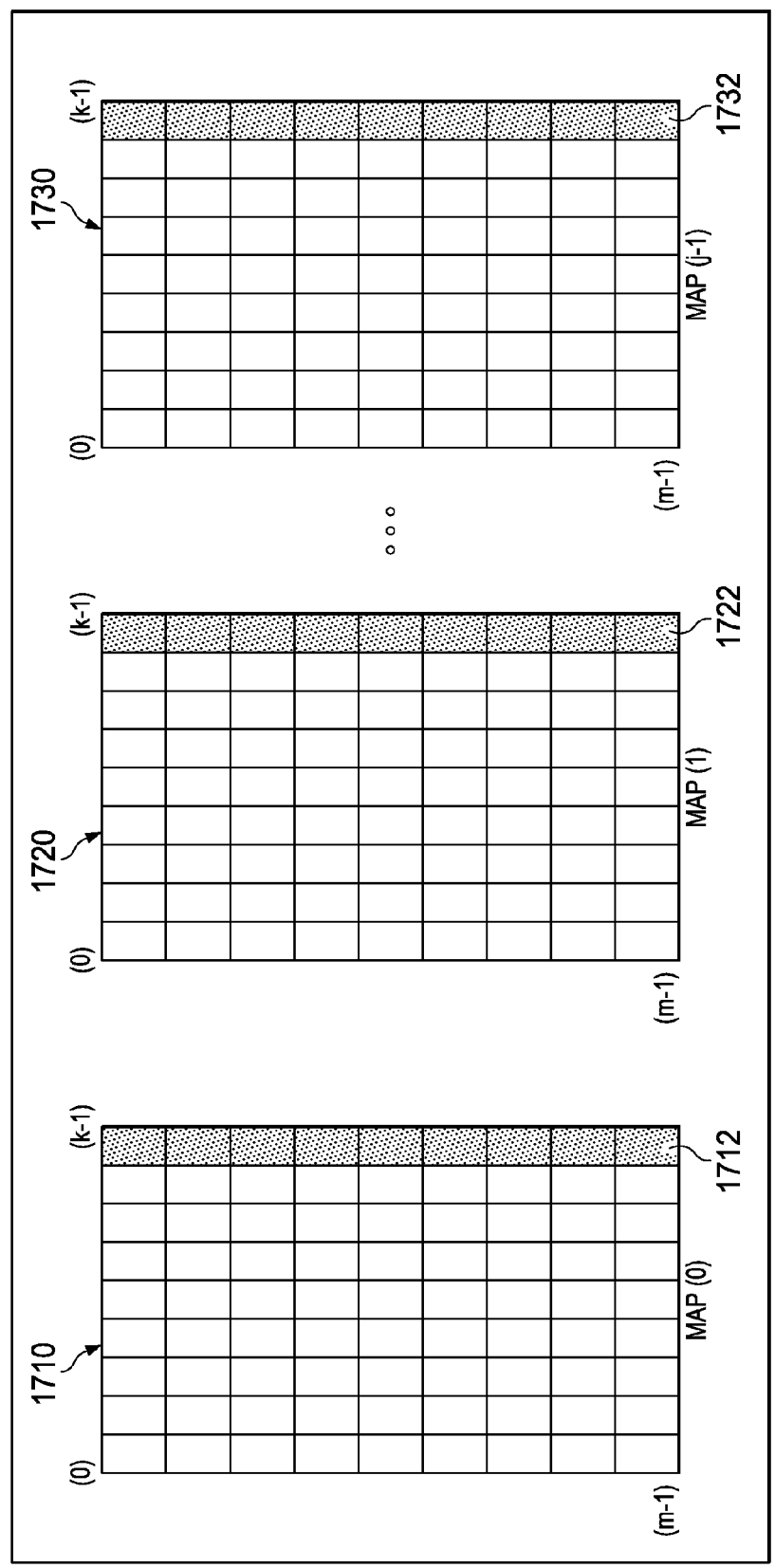
FIG. 17 is a logic diagram illustrating a lookup table 1700 for a level-two logically addressed emulator single-port memory in accordance with embodiments of the disclosure.

FIG. 17 is a logic diagram illustrating a lookup table 1700 for a level-two logically addressed emulator single-port memory in accordance with embodiments of the disclosure. Lookup table 1700 includes maps 1710, 1720, and 1730, wherein a total of "j" maps are arranged, wherein "j" is the number of banks at level one. Each map (e.g., map 1720) has "m" number of rows, which is the number of words per level-one bank. Each map also has "k" number of columns, which is the number of blocks at level two. Each map also has a bank hole column (e.g., bank hole column 1712, 1722, and 1732) such that each map has "k+1" columns.

Figure 18:
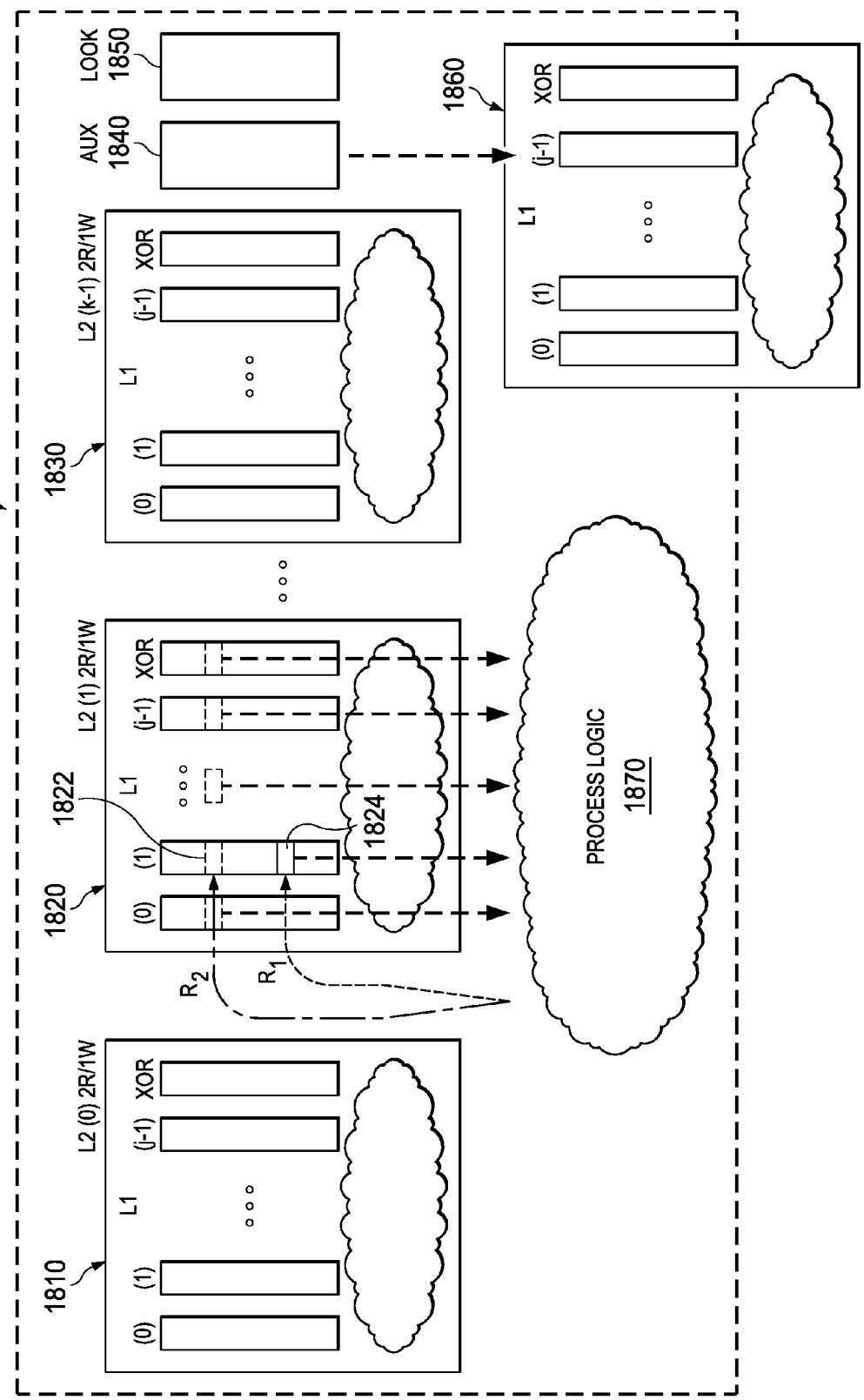
FIG. 18 is a logic diagram that illustrates simultaneous read operations in a full dual read and write architecture multiport memory emulator in accordance with embodiments of the disclosure.

FIG. 18 is a logic diagram that illustrates simultaneous read operations in a full dual read and write architecture multiport memory emulator in accordance with embodiments of the disclosure. Emulator 1800 includes encoded memory systems 1810, 1820, and 1830 that are arranged to form a level-two logically addressed multi-port memory emulator. Emulator 1800 also includes an auxiliary memory 1840 that is arranged as encoded memory system 1860, lookup table 1850, and process logic 1870.

As illustrated, both the read operation "R1" and read operation "R2" are directed at the same level-one bank (encoded memory system 1820) in the same level-two block. For example, read operation "R1" is accomplished using a read operation to the indicated address, whereas read operation "R2" is accomplished using parallel access from all banks (including the XOR bank) except the bank to which the "R1" read operation is directed. Thus, parallel reads are accomplished because the level-one encoded memory system 1820 supports the simultaneous read operations.

Figure 19:
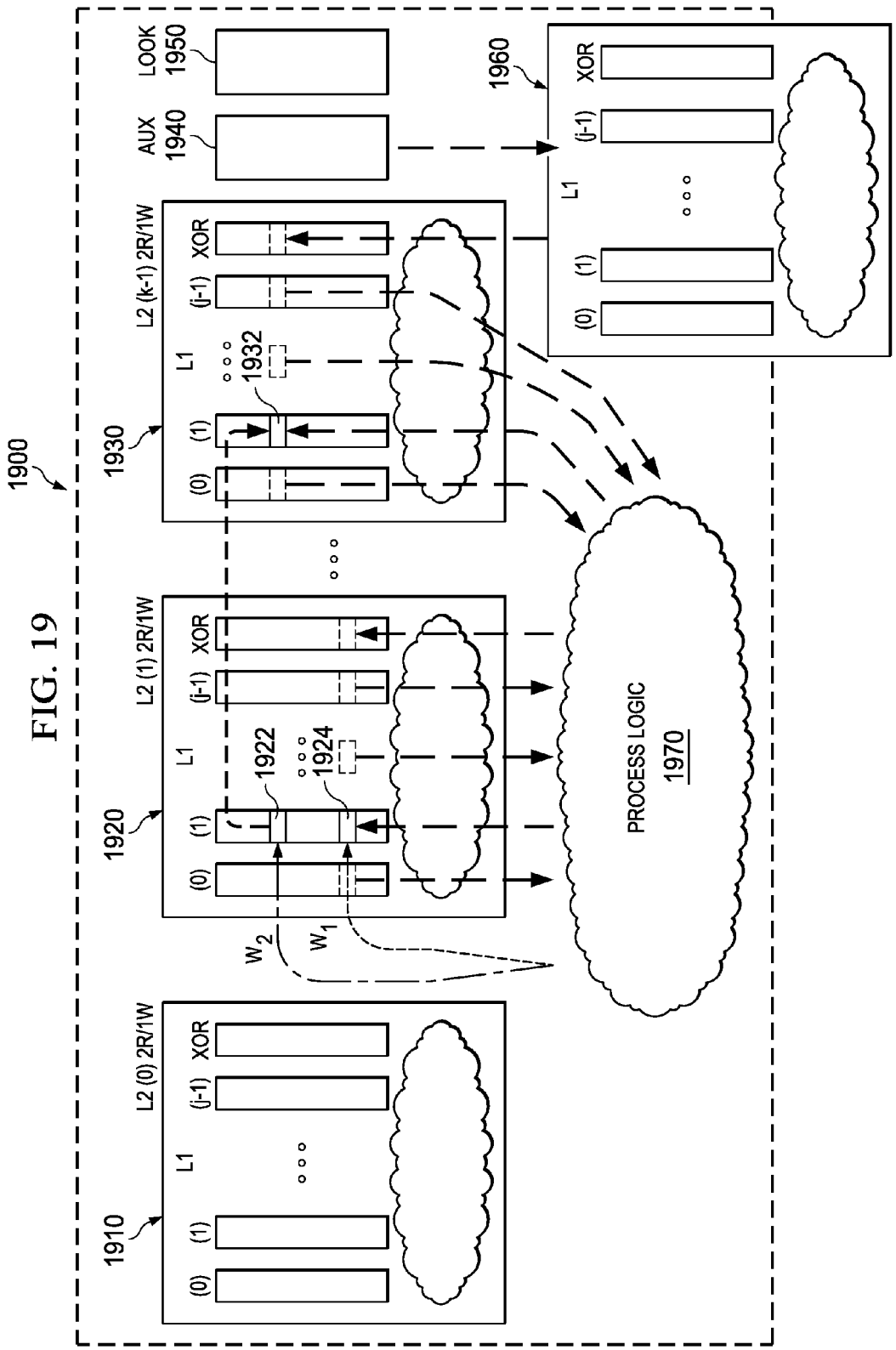
FIG. 19 is a logic diagram that illustrates simultaneous write operations in a full dual read and write architecture multiport memory emulator in accordance with embodiments of the disclosure.

FIG. 19 is a logic diagram that illustrates simultaneous write operations in a full dual read and write architecture multiport memory emulator in accordance with embodiments of the disclosure. Emulator 1900 includes encoded memory systems 1910, 1920, and 1930 that are arranged to form a level-two logically addressed multi-port memory emulator. Emulator 1900 also includes an auxiliary memory 1940 that is arranged as encoded memory system 1960, lookup table 1950, and process logic 1970.

As illustrated, the write operation "W1" is directed to location 1924 while write operation "W2" is directed to location 1922. Both locations 1924 and 1922 are included in the same level-one bank (encoded memory system 1920) of the same level-two block. Write operation "W1" is accomplished by directing a write operation to the indicated address (1924) and also by updating the XOR bank of encoded memory system 1920 via process logic 1970 (which provides level-two operations). The write operation "W2" is accomplished by directing the operand to be written to the (current) corresponding hole at location 1932, which is in the level-one bank 1 of level-two block "k–1" (e.g., encoded memory system 1930). Also write operation "W2" also provides encoding updates to the XOR block in the level-two block "k–1" (e.g., in encoded memory system 1930. Thus, parallel writes are accomplished because the level-two logically addressed portion of multi-port memory emulator 1900 supports the simultaneous write operations.

Figure 20:
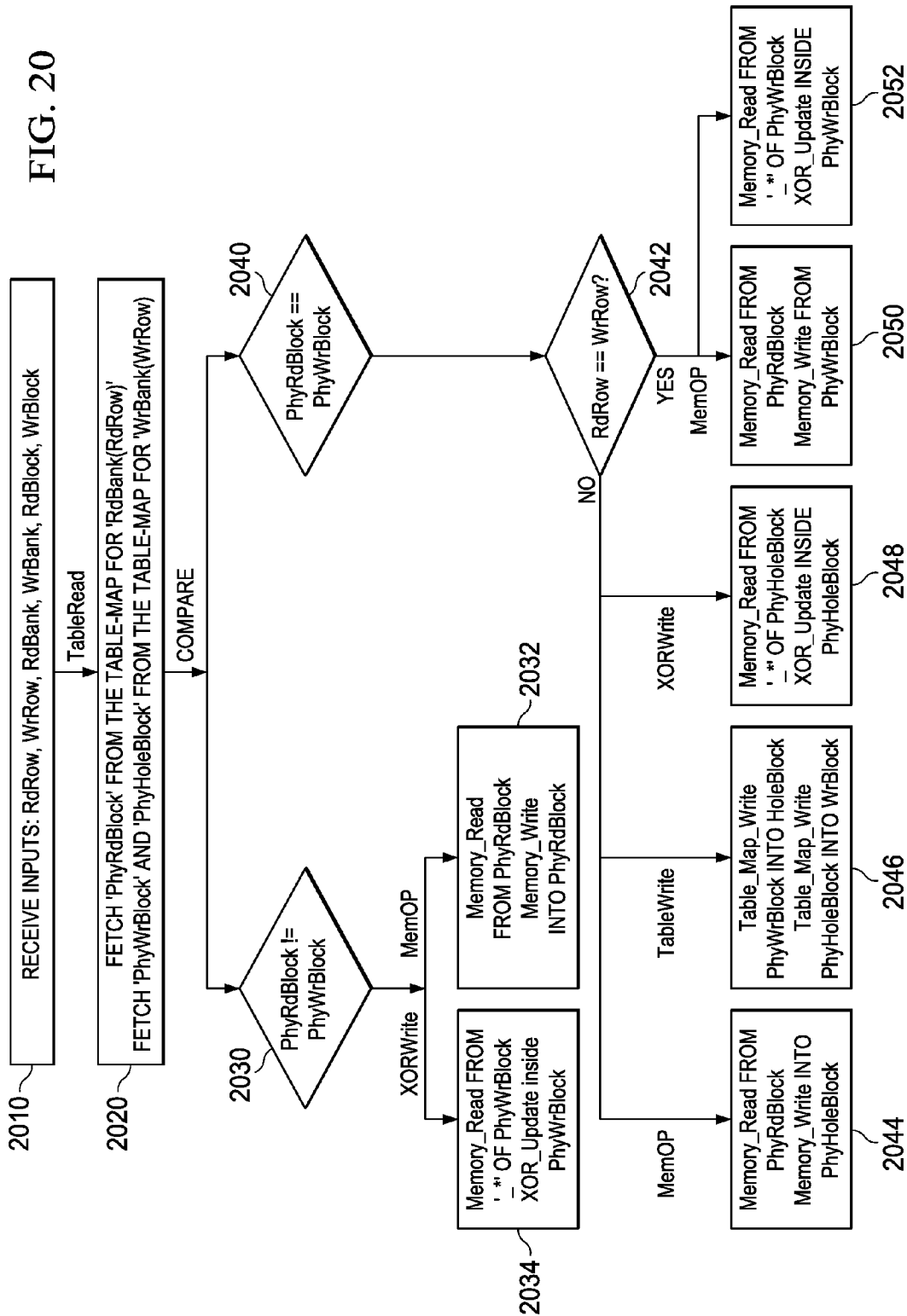
FIG. 20 is a flow diagram illustrating a process for concurrently reading and writing two ports of a logically addressed multiport memory emulator in accordance with embodiments of the disclosure.

FIG. 20 is a flow diagram illustrating a process for concurrently reading and writing two ports of a logically addressed multiport memory emulator in accordance with embodiments of the disclosure. Process 2000 is initiated in operation 2010 when the inputs RdRow, WrRow, RdBank, WrBank, RdBlock, and WrBlock are received in association with the two received memory commands. In operation 2020, a lookup table read operation from the table map is used to determine (e.g., fetch) the value of PhyRdBlock in response to RdBank(RdRow) and to determine the value of PhyWrBlock in response to WrBank(WrRow) and the value of PhyHoleBlock in response to WrBank(WrRow). (The PhyHoleBlock is the current physical location of the hole for the selected block).

In operation 2030, the physical block addresses (PhyRdBlock and PhyWrBlock) are compared to determine whether the same physical bank is implicated by both the first and the second received read commands. If the same physical bank is not implicated by both the first and the second received memory command, process flow continues with operation 2034 (XORWrite) and operation 2032 (MemOP). In operation 2034, a memory read operation from all write banks "_*" (e.g., except WrBank) of PhyWrBlock is performed as well as an XOR update (using the returned operands) is performed and stored within PhyWrBlock. In operation 2032 a memory read operation from PhyRdBlock is performed as well as a memory write operation into PhyRdBlock is performed. Process flow terminates until the next two memory commands are received.

In operation 2040, the physical block addresses (PhyRdBlock and PhyWrBlock) are compared to determine whether the same physical bank is implicated by both the first and the second received read commands. If the same physical bank is implicated by both the first and the second received memory command, process flow continues with operation 2042. In operation 2042, if the same physical address is not implicated by both the row to be read (RdRow) and the row to be written (WrRow), process flow continues with operations 2044, 2046, and 2048. If the same physical address is implicated by both the row to be read (RdRow) and the row to be written (WrRow), process flow continues with both operations 2050 and 2052.

In operation 2044, a memory read operation from PhyRdBlock is performed as well as a memory write operation into PhyHoleBlock is performed. In operation 2046, a table write operation is performed where PhyWrBlock is written in the Hole Block and the PhyHoleBlock is written into the Write Block. In operation 2048, a memory read operation from all write banks "_*" (except WrBank) of PhyHoleBlock is performed as well as an XOR update is performed (using the operands returned by the memory read operation "_*") and stored within PhyHoleBlock. Process flow terminates until the next two memory commands are received. In operation 2050, a memory read operation from PhyRdBlock is performed as well as a memory write operation from PhyWrBlock is performed. In operation 2052, a memory read operation from all write banks "_*" (except WrBank) of PhyWrBlock is performed as well as an XOR update is performed and stored within PhyWrBlock. Process flow terminates until the next two memory commands are received.

Figure 21:
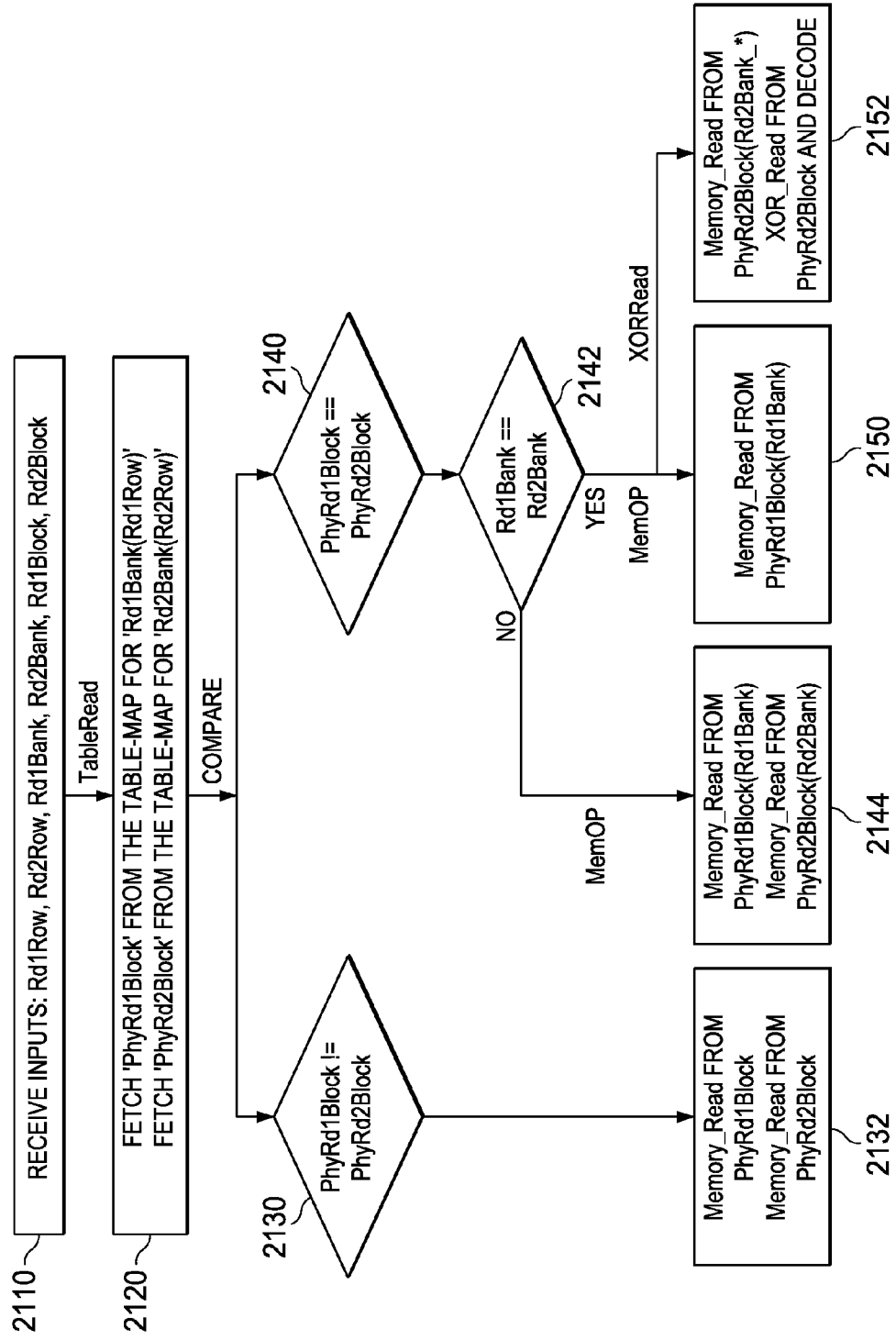
FIG. 21 is a flow diagram illustrating a process for concurrently reading two ports of a logically addressed multiport memory emulator in accordance with embodiments of the disclosure.

FIG. 21 is a flow diagram illustrating a process for concurrently reading two ports of a logically addressed multiport memory emulator in accordance with embodiments of the disclosure. Process 2100 is initiated in operation 2110 when the inputs $Rd_1Row$, $Rd_2$ Row, $Rd_1Bank$, $Rd_2Bank$, $Rd_1Block$, and $Rd_2Block$ are received in association with the two received memory commands. In operation 2120, lookup table read operations from the table map are used to determine (e.g., fetch) the value of $PhyRd_1Block$ in response to $Rd_1Bank(Rd_1Row)$ and to determine the value of $PhyRd_2Block$ in response to $Rd_2Bank(Rd_2$ Row).

In operation 2130, the physical block addresses ($PhyRd_1Block$ and $PhyRd_2Block$) are compared to determine whether the same physical bank is implicated by both the first and the second received read commands. If the same physical bank is not implicated by both the first and the second received memory command, process flow continues with operation 2132 In operation 2132 a memory read operation from $PhyRd_1Block$ is performed as well a memory read operation from $PhyRd_2Block$ is performed. Process flow terminates until the next two memory commands are received.

In operation 2140, the physical block addresses ($PhyRd_1Block$ and $PhyRd_2Block$) are compared to determine whether the same physical bank is implicated by both the first and the second received read commands. If the same physical bank is implicated by both the first and the second received memory command, process flow continues with operation 2142. In operation 2142, if the same physical address is not implicated by both rows to be read ($Rd_1Row$ and $Rd_2$ Row), process flow continues with operation 2144. If the same physical address is implicated by both rows to be read ($Rd_1Row$ and $Rd_2$ Row), process flow continues with both operations 2150 and 2152.

In operation 2144, a memory read operation from $Rd_1Bank$ of $PhyRd_1Block$ is performed as well as a memory read operation from $Rd_2Bank$ of $PhyRd_2Block$ is performed. Process flow terminates until the next two memory commands are received. In operation 2150, a memory read operation from $Rd_1Bank$ of $PhyRd_1Block$ is performed. In operation 2152, a memory read operation from all $Rd_2Bank\_*$ of $PhyRd_2Block$ is performed as well as an XOR update is performed by reading from $PhyRd_2Block$ and the XOR bank. Process flow terminates until the next two memory commands are received.

Figure 22:
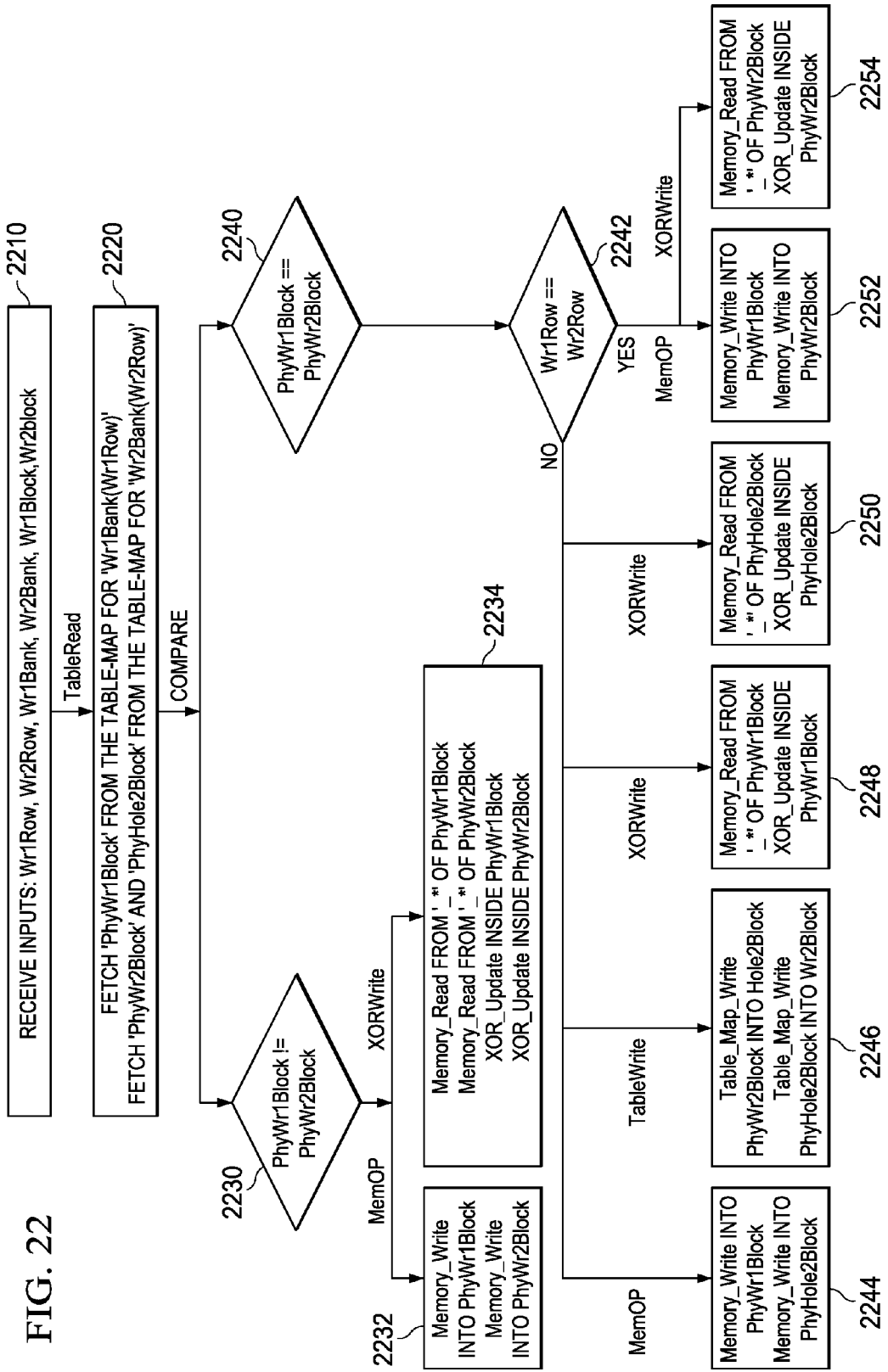
FIG. 22 is a flow diagram illustrating a process for concurrently writing two ports of a logically addressed multiport memory emulator in accordance with embodiments of the disclosure.

FIG. 22 is a flow diagram illustrating a process for concurrently writing two ports of a logically addressed multiport memory emulator in accordance with embodiments of the disclosure. Process 2200 is initiated in operation 2210 when the inputs $Wr_1Row$, $Wr_2$ Row, $Wr_1Bank$, $Wr_2Bank$, $Wr_1Block$, and $Wr_2Block$ are received in association with the two received memory commands. In operation 2220, a lookup table read operation from the table map is used to determine (e.g., fetch) the value of PhyWr$_1$Block in response to Wr$_1$Bank(Wr$_1$Row) and to determine the value of PhyWr$_2$Block in response to Wr$_2$Bank(Wr$_2$ Row) and the value of Phy$_2$HoleBlock in response to Wr$_2$Bank(Wr$_2$ Row). (The Phy$_2$HoleBlock is the current physical location of the hole for the selected block).

In operation 2230, the physical block addresses (PhyWr$_1$Block and PhyWr$_2$Block) are compared to determine whether the same physical bank is implicated by both the first and the second received read commands. If the same physical bank is not implicated by both the first and the second received memory command, process flow continues with operation 2234 (XORWrite) and operation 2232 (MemOP). In operation 2234, a memory read operation from all write banks "_*" of PhyWr$_1$Block is performed as well as XOR updates (using the returned operands) are respectively performed and stored within PhyWr$_1$Block. Likewise a memory read operation from all write banks "_*" of PhyWr$_2$Block is performed as well as XOR updates (using the returned operands) are respectively performed and stored and PhyWr$_2$Block. In operation 2232 a memory write operation into PhyWr$_1$Block is performed as well as a memory write operation into PhyWr$_2$Block is performed. Process flow terminates until the next two memory commands are received.

In operation 2240, the physical block addresses (PhyWr$_1$Block and PhyWr$_2$Block) are compared to determine whether the same physical bank is implicated by both the first and the second received read commands. If the same physical bank is implicated by both the first and the second received memory command, process flow continues with operation 2242. In operation 2242, if the same physical address is not implicated by both rows to be written (Wr$_1$Row and Wr$_1$Row), process flow continues with operations 2244, 2246, 2248, and 2250. If the same physical address is implicated by both the row to be read (WrRow) and the row to be written (WrRow), process flow continues with both operations 2252 and 2254.

In operation 2244, a memory write operation into PhyWr$_1$Block is performed as well as a memory write operation into PhyHole$_2$Block is performed. In operation 2246, a table-write operation is performed where PhyWr$_2$Block is written in the Hole$_2$Block and the PhyHole$_2$Block is written into the Wr$_2$Block. In operation 2248, a memory read operation from "_*" of PhyWr$_1$Block is performed as well as an XOR update is performed (using the operands returned by the memory read operation "_*") and stored within PhyWr$_1$Block. In operation 2250, a memory read operation from "_*" of PhyHole$_2$Block is performed as well as an XOR update is performed (using the operands returned by the memory read operation "_*") and stored within PhyHole$_2$Block. Process flow terminates until the next two memory commands are received.

In operation 2252, a memory write operation into PhyWr$_1$Block is performed as well as a memory write operation into PhyWr$_2$Block is performed. In operation 2254, a memory read operation from "_*" of PhyWr$_2$Block is performed as well as an XOR update is performed and stored within PhyWr$_2$Block. Process flow terminates until the next two memory commands are received.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A multiport memory emulator device, comprising:
an input buffer that is arranged to receive a first and a second memory command, wherein each command is respectively associated with a logical address that includes a row address portion and a bank address portion;
a memory array of bitcells that is arranged as rows and memory banks, wherein each memory bank has an associated bank address and is arranged to physically store one word from each row, wherein each row has an associated row address and is arranged to physically store one word from each memory bank, and wherein the memory array includes an auxiliary memory bank that is arranged to provide a bitcell for physically storing an additional word for each row; and
a lookup table that is arranged to determine whether the bank address portion of the first memory command is equal to the bank address portion of the second memory command, is arranged to translate the bank address portion of each of the first and second memory commands respectively into a first and second physical bank address, and is arranged to, in response to the determination that the bank address portions are equal, assign a bank address of a bank that is currently unused to the second physical bank address, and designate the bank associated with the first physical bank address as a currently unused bank for subsequently received memory commands.

2. The device of claim 1, wherein each word is a series of one or more single-port bitcells.

3. The device of claim 1, wherein each physical address of the non-auxiliary banks is respectively initialized in the lookup table using the logical addresses for each of the non-auxiliary banks.

4. The device of claim 1, wherein the bank address portion of the received memory command is arranged to uniquely address each of the non-auxiliary banks.

5. The device of claim 1, comprising an output buffer that is arranged to output data from the selected physically addressed word when at least one of the first and second memory commands is a read command.

6. The device of claim 1, comprising a pipeline stage that is arranged to assert the row portions of the first and second memory commands and assert the first and second physical bank addresses.

7. The device of claim 6, wherein asserted row portions of the first and second memory commands and the asserted first and second physical bank addresses are provided to the memory array.

8. The device of claim 7, wherein the memory array is arranged to concurrently process the first and second memory commands in response to the asserted row portions of the first and second memory commands and the asserted first and second physical bank addresses.

9. The device of claim 8, wherein the first memory command is a read command and the second memory command is a write command.

10. The device of claim 1, wherein first and second memory operations are executed concurrently for the received memory commands, wherein each of the first and second memory operations is processed using a lookup operation that occurs during a first cycle of the two memory operations, and using a main memory read and/or write operation that occurs during the second cycle of the two memory operations.

11. The device of claim 10, wherein the second memory operation is processed using a lookup table write operation that occurs after the lookup operation, wherein the lookup operation occurs during a first portion of the first cycle or occurs during the first cycle of the first and second memory operations.

12. A multiport memory emulator device, comprising:
an input port that is arranged to receive a first and a second memory command, wherein each command is respectively associated with an address and a command type;
a main memory array of bitcells that is arranged as rows and memory banks, wherein each bitcell is a single port bitcell, and wherein the main memory array includes a physical address range that is arranged to be addressed using the addresses respectively associated with the first and second memory commands;
a secondary memory having a physical address space; and
a process logic unit that is arranged to process the first and second memory commands within one operation clock cycle by storing and retrieving data from both the main memory array and the secondary memory array.

13. The device of claim 12, comprising an output buffer that is arranged to output data in response to data stored both the main memory array and the secondary memory array when at least one of the command types of the first and second memory commands is a read command.

14. The device of claim 13, wherein the command types the first and second memory commands are both read command types, are both write command types, or are read and write command types.

15. The device of claim 14, wherein the secondary memory is arranged with auxiliary memory that is logically addressed when both command types are write command types.

16. The device of claim 15, wherein the secondary memory is arranged with an encoded memory bank that is encoded and decoded using an exclusive-OR (XOR) function when both command types are read command types.

17. A method for emulating multiport memory, comprising:
receiving a first and a second memory command, wherein each command is respectively associated with an address and a command type;
and wherein a main memory includes a physical address range that is arranged to address each word of bitcells in a main memory array that is arranged as rows and memory banks, wherein the words are addressed using the addresses respectively associated with the first and second memory commands;
using a secondary memory having a physical address space to provide encoded data for determining the contents of a word when both command types are read command types; and
using the secondary memory to provide a word for physically storing an additional word and translating a logical address into a physical address for each row of the main memory when both the command types are write command types.

18. The method of claim 17, wherein the first and second memory commands are processed within one operation clock cycle by storing and retrieving data from both the main memory array and the secondary memory array.

19. The method of claim 17, wherein the encoded data is encoded and stored using an exclusive-OR function (XOR) and retrieved and decoded using the XOR function.

20. The method of claim 17, wherein the secondary memory includes a memory map to maintain the physical memory address of the open memory word in a row that is not currently associated with a logical address.

* * * * *